United States Patent

Yoshikawa et al.

[11] Patent Number: 6,154,479
[45] Date of Patent: Nov. 28, 2000

[54] VCSELS (VERTICAL-CAVITY SURFACE EMITTING LASERS) AND VCSEL-BASED DEVICES

[75] Inventors: Takashi Yoshikawa; Kaori Kurihara; Hideo Kosaka, all of Tokyo, Japan

[73] Assignee: NEC Corporation, Tokyo, Japan

[21] Appl. No.: 09/017,038

[22] Filed: Feb. 2, 1998

Related U.S. Application Data

[62] Division of application No. 08/528,886, Sep. 15, 1995, Pat. No. 5,778,018.

[30] Foreign Application Priority Data

| Oct. 13, 1994 | [JP] | Japan | 6-247926 |
| Oct. 19, 1994 | [JP] | Japan | 6-253324 |
| Oct. 24, 1994 | [JP] | Japan | 6-258069 |

[51] Int. Cl.⁷ .................. H01S 3/08; H04J 14/06
[52] U.S. Cl. .................. 372/96; 372/43; 372/45; 372/50; 372/106; 359/115; 359/124; 359/156; 359/122
[58] Field of Search .................. 372/45, 43, 46, 372/50, 96, 108, 27, 106; 359/115, 122, 124, 154, 156

[56] References Cited

U.S. PATENT DOCUMENTS

| 5,181,221 | 1/1993 | Mori et al. | 372/46 |
| 5,245,622 | 9/1993 | Jewell et al. | 372/96 |
| 5,331,654 | 7/1994 | Jewell et al. | 372/45 |
| 5,412,680 | 5/1995 | Swirhun et al. | 372/46 |
| 5,436,922 | 7/1995 | Mori et al. | 372/46 |
| 5,493,577 | 2/1996 | Choquette et al. | 372/96 |
| 5,513,202 | 4/1996 | Kobayashi et al. | 372/96 |
| 5,778,018 | 7/1998 | Yoshikawa et al. | 382/45 |

FOREIGN PATENT DOCUMENTS

| 1-196884A | 8/1989 | Japan | 372/46 X |
| 1-265584 | 10/1989 | Japan | 372/46 X |
| 4-144183 | 5/1992 | Japan | 372/46 X |
| 4-242989 | 8/1992 | Japan | 372/46 X |
| 5-3369 | 1/1993 | Japan | 372/46 X |
| 5-160502 | 6/1993 | Japan | 372/46 X |

OTHER PUBLICATIONS

M. Shimizu, et al., "A Method of Polarization Stabilization In Surface Emitting Lasers", Japanese Journal of Applied Physics, vol. 30, No. 6A, Jun. 1991, pp. L1015–L1017.

T. Mukaihara, et al., "Polarization Control of Surface Emitting Lasers By Anisotropic Biaxial Strain", Japanese Journal of Applied Physics, vol. 31 (1992), pp. 1389–1390.

K.D. Choquette, et al., "Control of Vertical–Cavity Laser Polarization With Anisotropic Transverse Cavity Geometries", IEEE Photonics Technology Letters, vol. 6, No. 1, Jan. 1994, pp. 40–42.

H. Kosaka, et al., "Uniform Characteristics With Low Threshold and High Efficiency for a Single–Transverse––Mode Vertical–Cavity Surface–Emitting Laser–Type Device Array", IEEE Photonics Technology Letters, vol. 6, No. 3 (1994), pp. 323–325.

T. Mukaihara, et al., "Stress Effect for Polarisation Control of Surface Emitting Lasers", Electronics Letters, vol. 28, No. 6, Mar. 1992, pp. 555–556.

M. Shimizu, et al., "Polarisation Control for Surface Emitting Lasers", Electronics Letters, vol. 27, No. 12, Jun. 1991, pp. 1067–1069.

D. Vakhshoori, "Symmetry Considerations in Vertical–Cavity Surface–Emitting Lasers: Prediction of Removal of Polarization Isotropicity on (001) Substrates", Appl. Phys. Lett. 65 (3), Jul. 1994, pp. 259–261.

*Primary Examiner*—Brian Healy
*Attorney, Agent, or Firm*—Ostrolenk, Faber, Gerb & Soffen, LLP

[57] ABSTRACT

In order to control the polarization direction of laser light emitted by a vertical cavity surface emitting laser (VCSEL), the cross-sectional dimension of the p-DBR is so limited as to permit only a single fundamental transverse mode in a waveguide composed by the p-DBR. Some VCSEL-based devices are developed using arrays of VCSELs in which each VCSEL has a controlled direction of polarization.

23 Claims, 20 Drawing Sheets

- 13: INSIDE
- 14: OUTSIDE
- 15: LIGHT POLARIZED IN A DIRECTION VERTICAL TO POST SIDE SURFACE
- 17: POST SIDE SURFACE
- 16: LIGHT POLARIZED IN A DERECTION PARALLEL TO POST SIDE SURFACE

- 18: LONGER SIDE
- 19: SHORTER SIDE
- 20: POST CROSS SECTION
- 21: LIGHT POLARIZED IN A DIRECTION VERTICAL TO A LONGER SIDE
- 22: LIGHT POLARIZED IN A DIRECTION VERTICAL TO A SHORTER SIDE

25: RECTANGULAR WAVE GUIDE
26: ELECTRIC FIELD

102: DIRECTION OF POLARIZATION

103: OPTICAL FIBER

101: RECTANGULAR POST

121: CONTROL SIGNAL LIGHT
122: TRANSMITTING SIGNAL LIGHT
120: X-POLARIZED LASER
118: PBS
123: Y-POLARIZED LASER

VCSELS (VERTICAL-CAVITY SURFACE EMITTING LASERS) AND VCSEL-BASED DEVICES

This is a division of application Ser. No. 08/528,886, filed Sep. 15, 1995, now U.S. Pat. No. 5,778,018.

BACKGROUND OF THE INVENTION

The invention relates to vertical-cavity surface emitting lasers (VCSELs) and VCSEL-based devices, and more particularly to polarization control of VCSELs.

High density semiconductor laser arrays are promising for light sources of optical communication and optical computer systems.

In a manufacturing processes of a laser array, there is a flip chip bonding process, wherein separately produced laser elements are aligned on a common heat sink and are adhered to the surface of the heat sink by such low melting point metals as solder or AuSn. As for the alignment of the elements, a mechanical process is employed, and it is difficult to obtain a high density and high precision of alignment.

As another manufacturing process of a laser array, there is a monolithic process, wherein an array of laser elements is produced on a single substrate. In an edge emitting laser array as shown in FIG. 29, an array of mesa-stripes 106 is produced by monolithic process on a substrate. Each laser element including an active layer 107 can be driven separately by power-supplying through the corresponding electrodes 104. Alignment precision of this laser array is sufficiently high, since the alignment is determined by optical exposure.

A disadvantage of the edge emitting laser array shown in FIG. 29 is that the array is one-dimensional and is not good for use as a light source of an information processor.

An array of surface emitting lasers is more promising because it is two-dimensional, and high density alignment is easy, and coupling coefficient for coupling an array of surface emitting lasers to optical fibers is high. In optical switching or in optical interconnection, a laser array of surface emitting lasers of high density and high alignment accuracy is expected.

However, polarization control of a surface emitting laser is more difficult than that of an edge emitting laser.

FIG. 30 shows a cross-sectional view of a VCSEL of the prior art. An active layer 3 of InGaAs and optical confinement layers 4 of AlGaAs (the layers 3 and 4 are called intermediate layers) are sandwiched between a p-side semiconductor multi-layer reflector 2 (or p-side Distributed Bragg Reflector, and hereafter called a p-DBR 2) and an n-side semiconductor multi-layer reflector 6 (hereafter called an n-DBR 6). In an embodiment, the p-DBR 2 has 15.5 pairs of GaAs/AlAs layers, and the n-DBR 6 has 18.5 pairs of GaAs/AlAs layers. A resonator cavity is constituted by the p-DBR 2 and the n-DBR 6. The p-DBR 2 is formed into a post by etching, and the active layer 3 is inactivated by ion implantation leaving a region just underneath the post-type p-DBR 2 as shown by an inactivated region 5 in FIG. 30. A current flowing between an anode 1 and a cathode 7 excites laser oscillation, and generated laser light is emitted through a plane 100 of the substrate.

The plane 100 is called a plane of laser light emission, and each layer of the intermediate layers and the semiconductor multi-layer reflectors is formed on the substrate in parallel to the plane of laser light emission 100.

A VCSEL of FIG. 30 has a narrower beam angle and a larger mode separation than an edge emitting laser, and is more adapted to compose a laser array.

As is apparent from FIG. 29, polarization of emitted light of the edge emitting laser array is not influenced by array configuration as long as the pitch of the element arrangement is large enough to avoid mode coupling between neighboring elements. Thus, polarization of emitted light of a laser array of edge emitting lasers is determined by polarization of an element, wherein differences of waveguide loss and reflection coefficient between TE (transverse electric) and TM (transverse magnetic) modes are determined by the shape of the mesa stripe 106. In an embodiment shown by FIG. 29, polarization generated by TE mode in parallel to the substrate is predominant.

In order to obtain a polarization in a desired plane, the substrate of an edge emitting lasers must be held in parallel to the desired plane. Therefore, it will be very difficult to hold edge emitting lasers of different polarization on a common heat sink.

On the other hand, a VCSEL shown in FIG. 30, has no factor for influencing the polarity of the emitted light, and therefore, the polarization of the emitted light from an element laser will be a random and unstable, discontinuous change of polarization (called switching) often arising from temperature change or from current intensity change.

In recent applications of lasers, it is usual that such polarization-sensitive devices as beam splitters or polarizers are usually combined with the lasers, requiring a precise and stable polarization of emitted laser light. Even when polarization-sensitive devices are not used in combination with a laser, stability of polarization is still required, because change of polarization may cause change of reflection at end surfaces of devices, and the change of reflection may cause instability of a system.

Thus, polarization control of a VCSEL has been a problem in optical communication systems and in optical computer systems, and various proposals and attempts have been reported in this technical field. In one of such attempts, there is "A Method of Polarization Stabilization in Surface Emitting Lasers" by Mitsuaki Shimizu et al reported in Japanese Journal of Applied Physics vol. 30 pp. L1015–L1017, 1991. In this attempt, anisotropy of reflection coefficient is introduced for controlling polarization. Two side planes facing each other of the post type p-DBR 2 are coated by metal of high reflection coefficient. The validity of this attempt is not confirmed by experiments.

Another attempt is reported in "Polarization Control of Surface Emitting Lasers by Anisotropic Biaxial Strain" by Toshikazu Mukaihara et al in Japanese Journal of Applied Physics vol. 31 pp. 1389–1390, 1992. In this attempt, an elliptical groove is formed in the substrate, producing anisotropic strain in the path of the laser light. This anisotropic strain causes anisotropic reflection coefficient and polarization parallel to the major axis of the ellipsis becomes predominant. But there may arise various kinds of noisy strains from thermal expansion or from packaging stress.

In a Japanese patent application entitled "A semiconductor laser" and laid open as a Provisional Publication No. 265584/'89, a rectangular waveguide having a high refraction coefficient is provided in the laser path. A polarization in parallel to the longer sides of the rectangular waveguide is expected. But effectiveness of optical confinement in the high refraction waveguide is doubtful. When the laser light is not effectively confined in the waveguide, it will be difficult to obtain polarized light of sufficient intensity.

In a Japanese patent application entitled "A semiconductor laser" and laid open as a Provisional Publication No. 242989/'92, electrodes of a laser element are shaped in anisotropic form in a gain confinement type laser for obtaining anisotropic gain. But in a gain confinement type laser, the optical confinement is weak and the laser light will be diffused. Because of this diffusion, the ratio of light intensity confined underneath the electrodes (the coefficient of the optical confinement) is very small. Therefore, anisotropic gain obtained by anisotropic shape of electrodes will be small, and will give only a weak polarization effect.

In a Japanese patent application entitled "A surface emitting semiconductor laser" and laid open as a Provisional Publication No. 144183/'92, anisotropy of reflection coefficient is introduced by the anisotropic cross-sectional shape of the resonator cavity.

For example, the shapes of the cross-section of the resonator cavity of this prior art are as shown in FIG. 10. In this prior art, the reason why this anisotropic cross-section can control polarization is not described. In IEEE Photonics Technology Letters vol. 6, pp. 40–42, 1994, it is described that a rhombus 109 of FIG. 10 is ineffective in polarization control. In the aforementioned Japanese patent application entitled "A semiconductor laser" and laid open as a Provisional Publication No. 265584/'89, it is described as a prior art that an ellipse 108 of FIG. 10 is ineffective in polarization control. From these descriptions, it will be understood that the anisotropic cross-section cannot control polarization when there is no other factor for controlling polarization.

SUMMARY OF THE INVENTION

Therefore, a primary object of the present invention is to obtain an array of VCSELs wherein each VCSEL of the array has a precisely controlled polarization of emitted light. And effectiveness of the polarization control of this invention is to be evaluated by at least 50 (fifty) laser elements, in consideration of errors caused by scratches received in manufacturing process and by effect of stress or reflected light at evaluation process.

In an embodiment of this invention, the laser light propagation modes are limited to a single fundamental transverse mode. The p-DBR of this embodiment is shaped to a post type by etching and size of the post cross-section is so limited as to permit only a single fundamental transverse mode. Thus, mode size of light confined by the post is slightly larger than the post size, and polarization of laser light is effectively controlled by post shape.

The n-DBR of this embodiment is not shaped and laser light is diffused in the n-DBR producing components of light which are not parallel to the side surface of the post. These components are reflected in the n-DBR and reenter to the p-DBR to be reflected by the side surface of the post in polarity-sensitive reflection. This polarity-sensitive reflection can control the polarity of the emitted laser.

BRIEF DESCRIPTION OF THE DRAWINGS

Further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Figure 1:
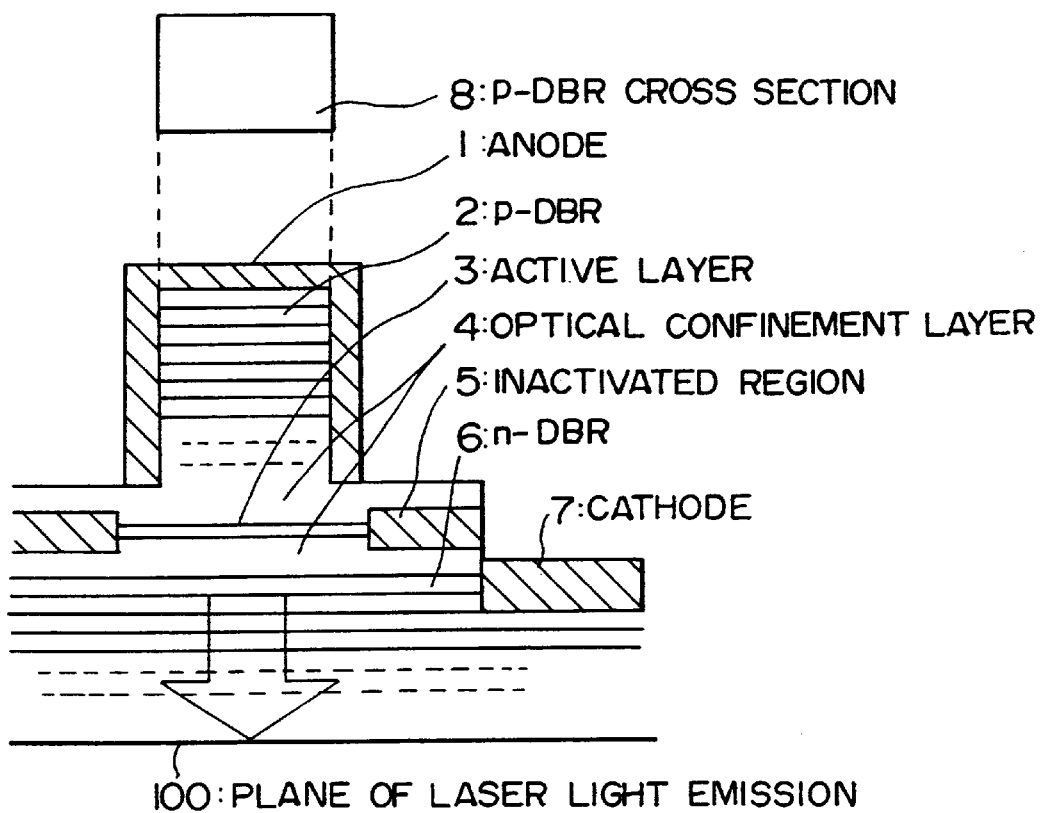
FIG. 1 shows a cross-sectional view of a VCSEL of a first embodiment of the present invention.

Referring to FIG. 1, a resonator cavity is composed between a post-type p-DBR 2 and an n-DBR 6. The semiconductor multi-layer reflectors (that is, p-DBR 2 and n-DBR 6) have layers of GaAs/AlAs for reflection. An intermediate layer comprises an active layer 3 of InGaAs and optical confinement layers 4 of AlGaAs. The p-DBR 2 is shaped into a post by reactive ion beam etching. The active layer 3 is inactivated excluding the part beneath the post type p-DBR 2, by implantation of proton, and becomes an inactivated region 5. The intermediate layer is etched into the depth of the n-DBR, and a cathode 7 is formed there. An anode 1 is formed by covering the whole outside surface of the post type p-DBR with electrode material.

Electric current flowing between the anode 1 and the cathode 7 excites laser oscillation, and the generated laser light is emitted through the plane of laser light emission 100 in the substrate.

In a first embodiment of this invention, the p-DBR cross-section 8 is a rectangle of 6 $\mu$m×5 $\mu$m. For polarization control, propagation modes must first be controlled. Each mode of propagation has its own polarization, and when there are two or more than two modes in a laser light, the polarization control of the light becomes very difficult.

Figure 2:
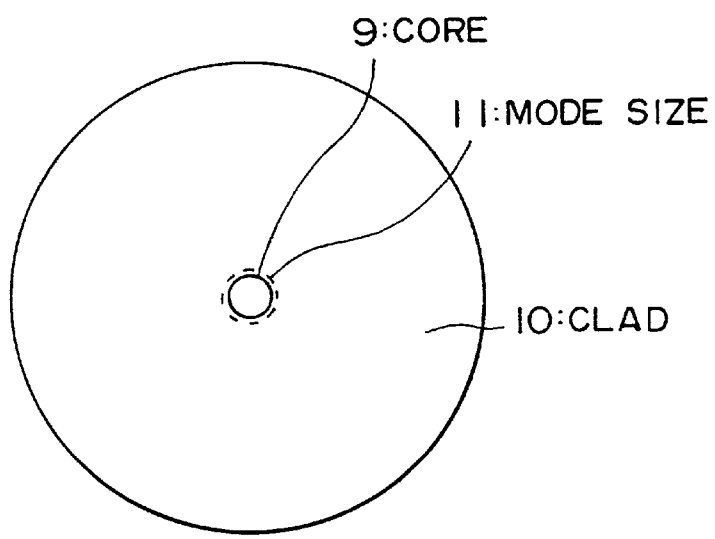
FIG. 2 shows a relation between a core size and a mode size in a single mode fiber.

In the VCSEL of FIG. 1, only a single fundamental transverse mode is permitted when the size of the p-DBR cross-section is smaller than 6.5 $\mu$m×6.5 $\mu$m. This fact can be induced by an analogy of a single mode optical fiber. FIG. 2 shows a cross-section of a single mode optical fiber. Here, mode size 11 is slightly larger than the size of a core 9. A mode of propagation with a mode size substantially larger than the core size can not be confined in the core.

Figure 3:
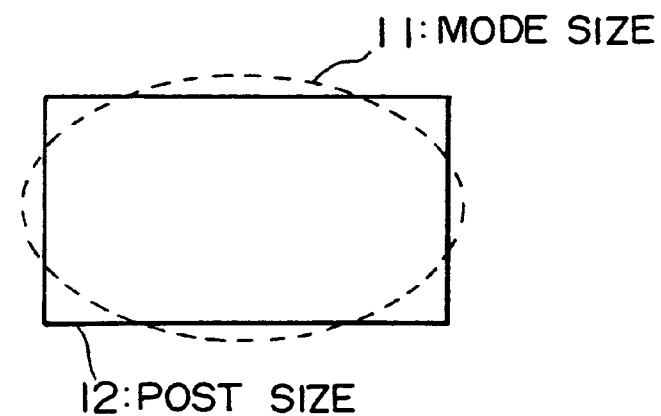
FIG. 3 shows a relation between a post cross-section of FIG. 1 and a mode size.
Figure 4:
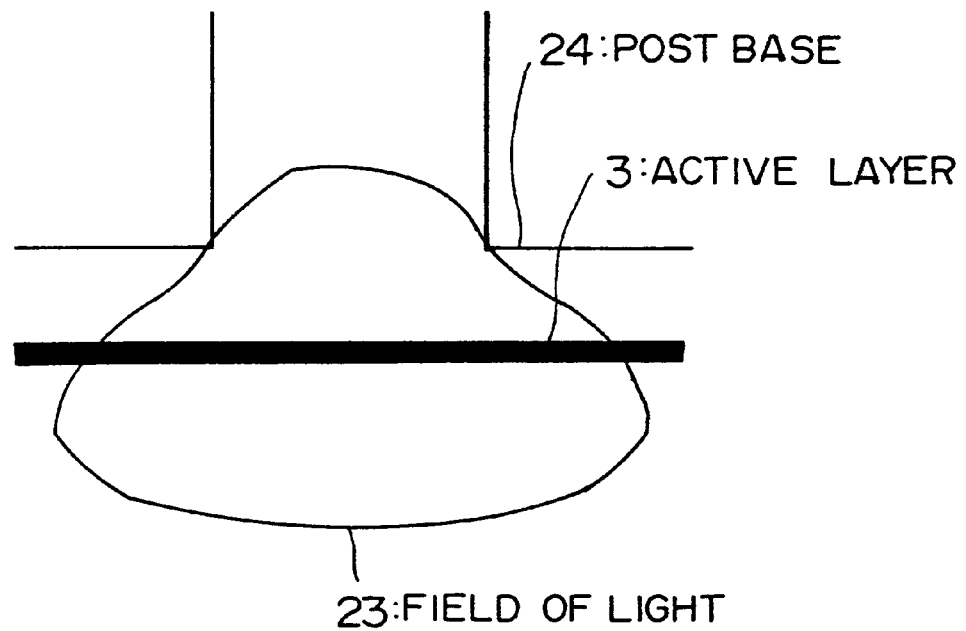
FIG. 4 shows diffusion of light outside of the p-DBR of FIG. 1.

FIG. 3 shows a relation between a mode size 11 and a post size 12 in the p-DBR 2. Since the post size is sufficiently small, only light of a single fundamental transverse mode with a mode size slightly larger than the post size is confined in the post. The polarization of oscillation with a mode size slightly larger than the post size is influenced by the structure of the side surfaces of the post. As shown in FIG. 4, the laser light is diffused after the light goes out from the p-DBR 2. The diffused light is reflected by the n-DBR 6 and reenters the p-DBR 2 at angles oblique to the axis of the post. Light beams oblique to the axis of the post are more influenced by the structure of side surfaces of the post.

Figure 5:
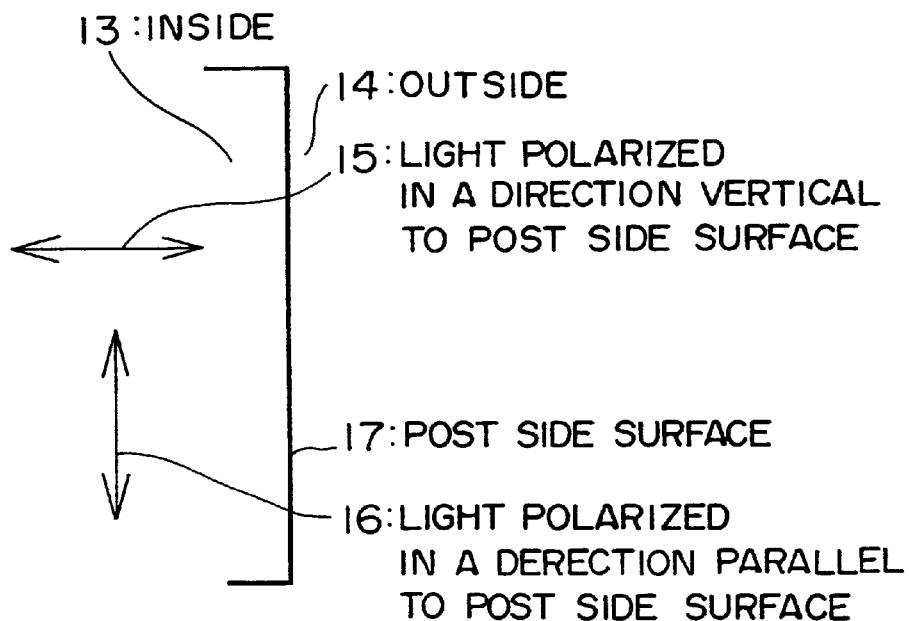
FIG. 5 shows polarization-sensitive reflection at a surface of the post of the first embodiment of the invention.

The p-DBR cross-section 8 is a rectangle, and the post is surrounded with plane surfaces. As shown in FIG. 5, a part of light goes out from inside 13 to outside 14 of the post through a post side surface 17. It will be understood that light 15 polarized in a direction perpendicular to the post side surface 17 goes out more easily to the outside 14 than light 16 polarized in a direction parallel to the post side surface.

Figure 6:
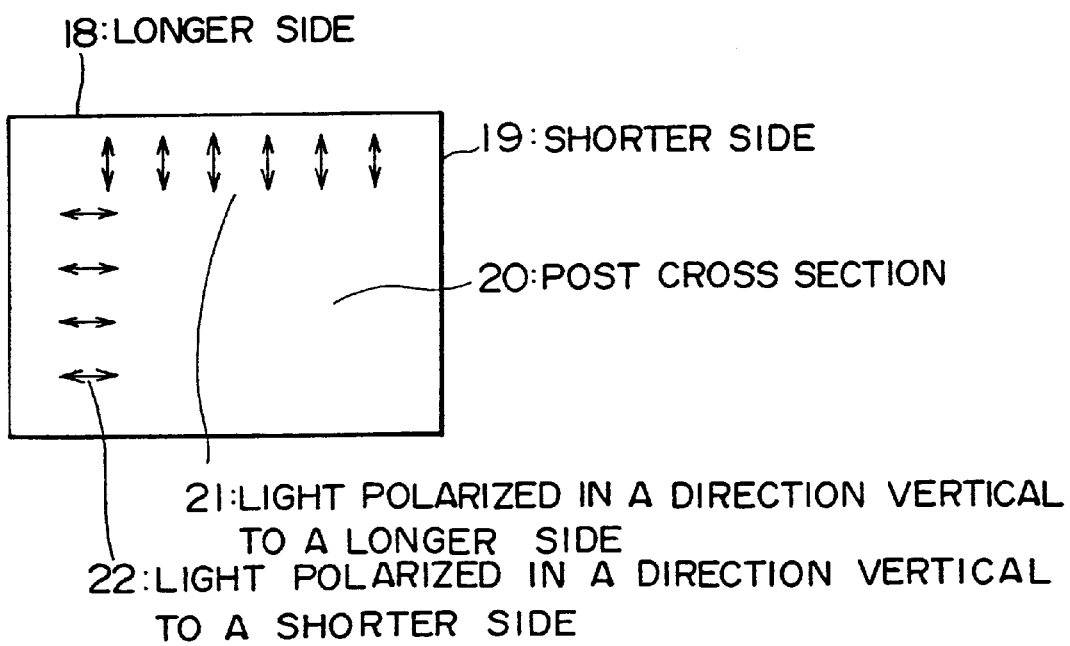
FIG. 6 shows the cross-section of the post and the directions of polarizations of the first embodiment of the invention.

As shown in FIG. 6, assume that there are two types of polarized light in a post cross-section 20, that is, light 21 polarized in a direction vertical to a long side 18, and light 22 polarized in a direction vertical to a short side 19. The light 21 polarized in a direction vertical to a long side goes out from the long sides and the light 22 polarized in a direction vertical to a short side goes out from the short sides, and the total amount of light going out to the outside 14 of the post is proportional to the length of sides. Thus, light 22 polarized in a direction vertical to a short side (that is polarized in a direction parallel to a long side) becomes dominant.

As is described in IEEE Photonics Technology Letters vol. 6, p. 323, no. 3, 1994 by H. Kosaka et al, a short side of length less than 6 $\mu$m gives a large amount of scattering loss to light polarized in a direction vertical to the short side. This phenomenon is used for polarization control of the present invention.

Returning to FIG. 4, the field of light 23 diffused in the optical confinement layer 4 is considered. The intensity of light at the post base 24 becomes weaker when the spacing of the active layer 3 from the post base 24 becomes larger. So, the smaller spacing is better to obtain sufficient difference of scattering loss between the light polarized vertical to the long side and the light polarized vertical to the short side. But, when the spacing is too small, the electric current flows from the base of the anode 1 to the cathode 7 near the side surface of the post and does not flow in the central part of the active layer 3, thus requiring high current for exciting laser oscillation and giving instability of oscillation mode. An optimum spacing between the post base 24 and the active layer 3 is found to be about one wavelength of the generated laser.

Figure 7:
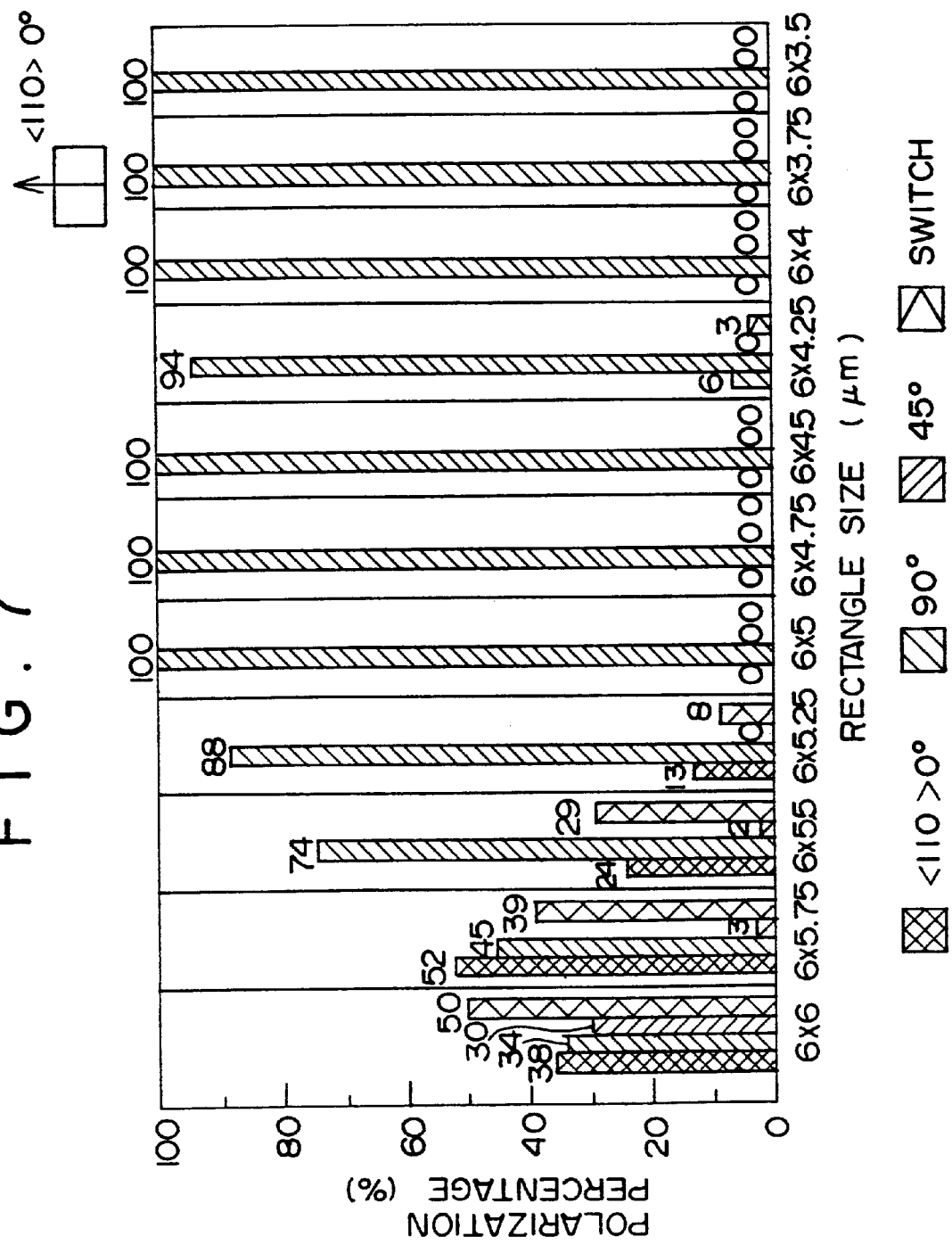
FIG. 7 shows a graph illustrating percentages of polarization directions and the post size of the first embodiment of the invention.

FIG. 7 shows an experimental result of polarization percentage of an array of 64 (8×8 matrix) VCSELs of FIG. 1. At a rectangle size of 6×5.75 $\mu$m polarization of 0° (parallel to a short side) has a large percentage. This fact is explained by a rectangular waveguide 25 of FIG. 8. For a fundamental mode of propagation in a rectangular waveguide 25, electric field 26 is perpendicular to long sides (parallel to short sides), when no field goes outside the waveguide 25. As the length difference between a long side and a short side is relatively small (6:5.75) scattering loss difference between 0° polarization and 90° polarization is relatively small. Thus, 0° polarization has a fairly large percentage at the size of 6×5.75 $\mu$m.

In the first embodiment, almost 100% control of polarization of 90° (parallel to a long side) is obtained in a range where the length of short side is 5 $\mu$m or less. At a rectangle size of 6×4.25 $\mu$m polarization of 90° is not 100%. Some of the laser elements are assumed to have received damages on the post in manufacturing processes.

Figure 9:
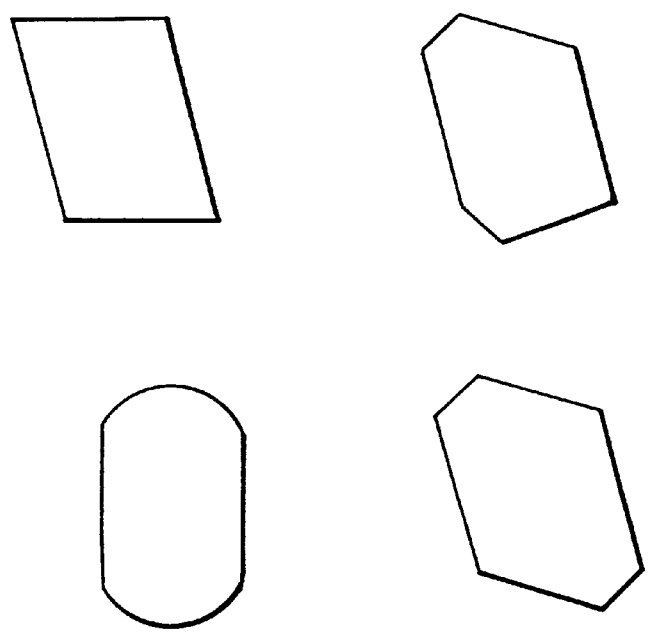
FIG. 9 shows various kinds of post cross-section used in the first embodiment of the present invention.
Figure 10:
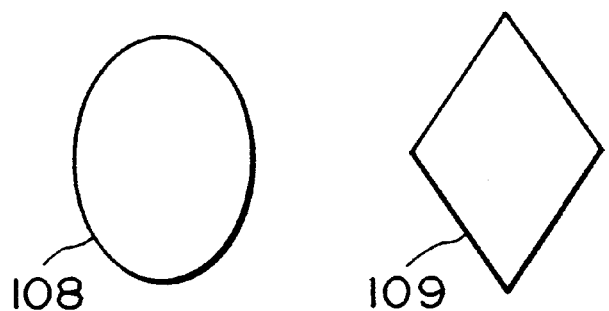
FIG. 10 shows cross-sections of posts of prior arts.

In the first embodiment of this invention shown in FIG. 1, the cross-section of the post is rectangle. But cross-sections other than a rectangular cross-section, for example, such cross-sections as shown in FIG. 9 can be used in the present invention. In all these cross-sections of FIG. 9, there is a pair of parallel sides having a largest length of all the straight lines in the periphery of the cross-section. Here, straightness of a straight line is defined in relation to the wavelength in the post of the emitted laser, that is, ripples or curvatures in a straight line smaller than the wavelength are ignored.

And in the first embodiment, the VCSEL is made of GaAs/AlAs alloys. But other semiconductors can be used. Wavelength in the post of the emitted laser is determined by semiconductor materials, and the cross-sectional size of the post of the first embodiment of this invention must be determined in accordance with the wavelength of the emitted laser.

Figure 8:
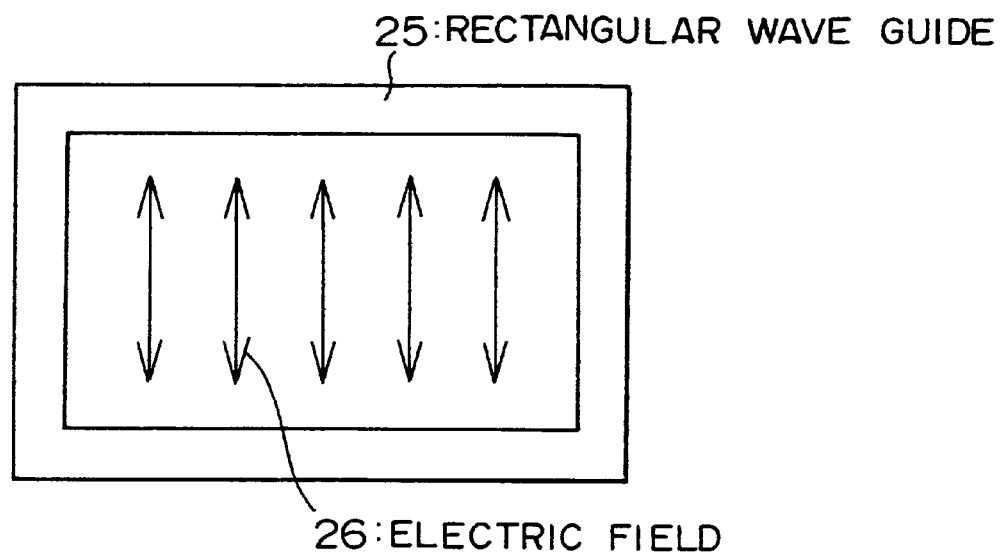
FIG. 8 shows the direction of polarization of a fundamental propagation mode in a rectangular waveguide.

A second embodiment of this invention is suggested by FIG. 7 (rectangle size of 6×5.75 $\mu$m) and FIG. 8. As is described with reference to FIG. 4, when the spacing of the active layer 3 from the post base 24 becomes larger, the intensity of light at the post base 24 becomes weaker and the oblique component of light entering the post becomes relatively smaller. So, the scattering loss from the side surface of the post becomes smaller, and the propagation mode becomes confined in the post as a rectangular waveguide 25 in FIG. 8.

Figure 11:
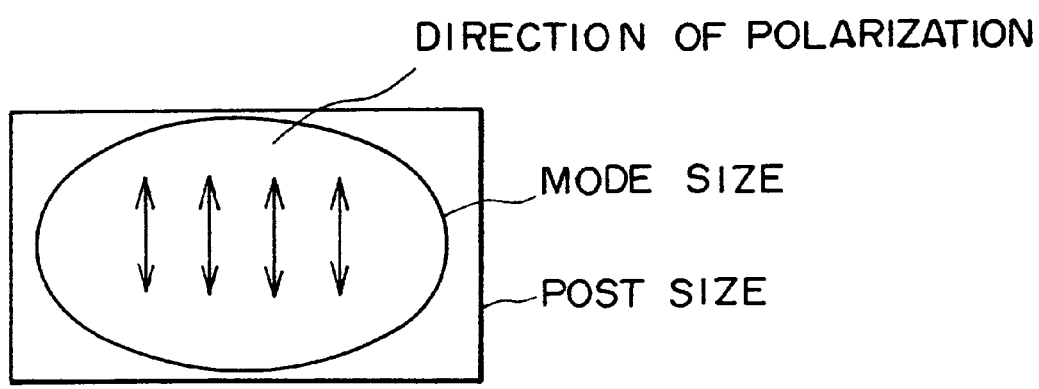
FIG. 11 shows a mode of propagation in a second embodiment of this invention.

In the second embodiment of this invention, the spacing between the active layer 3 and the post base 24 is about three wavelengths and a single fundamental transverse mode is confined in the post type p-DBR as shown in FIG. 11. The mode is a TE mode, where the electric field is perpendicular to long sides of cross-section of the waveguide composed by the post. Thus, direction of polarization is in parallel to short sides.

Figure 12:
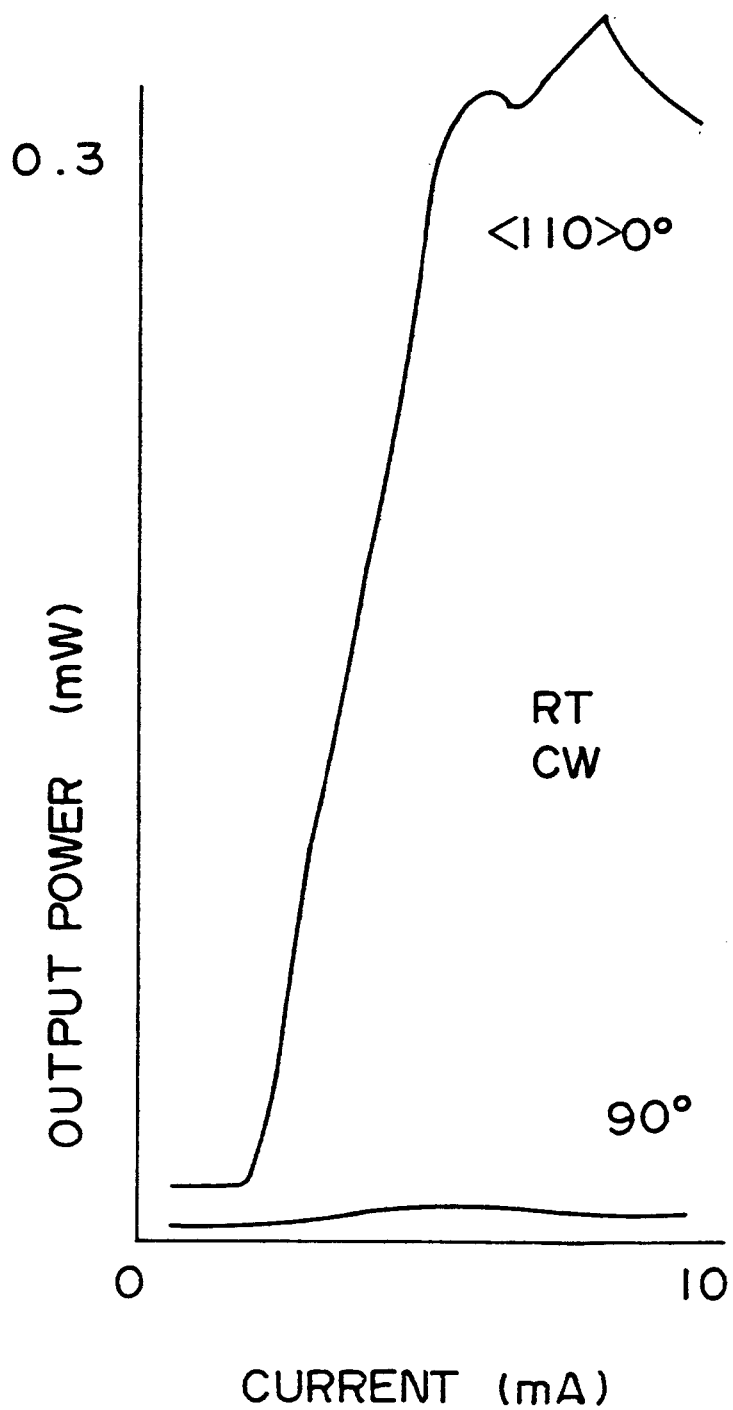
FIG. 12 shows a relation between exciting current and light output in the second embodiment of this invention.

FIG. 12 shows a relation between exciting current and light output in the second embodiment of this invention. The measurement is made at a room temperature (RT) and for a continuous oscillation (CW). For a sufficient exciting current, polarization in 0° (parallel to short side) is strong, while polarization in 90° is practically zero.

Figure 13:
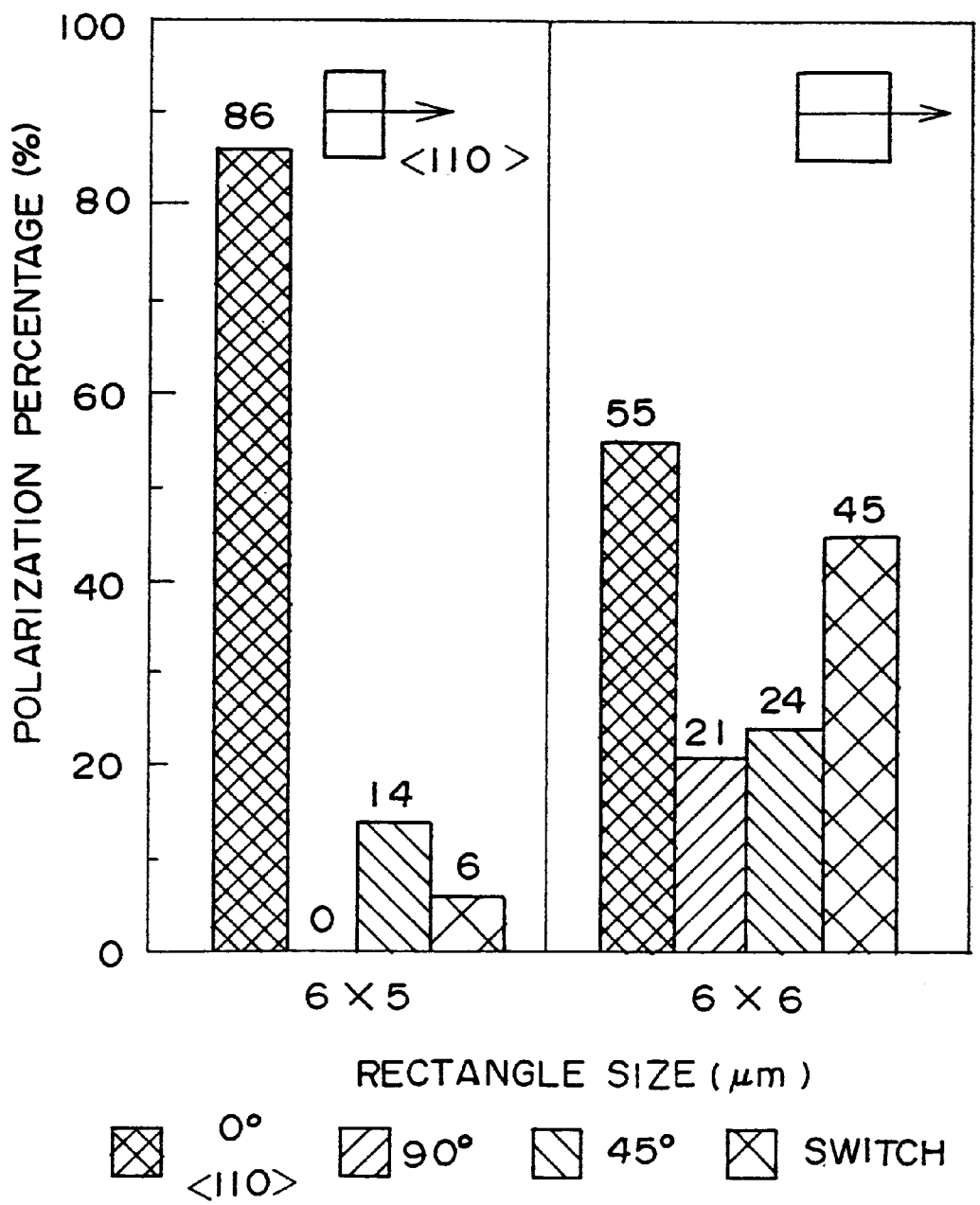
FIG. 13 shows a graph illustrating percentage of polarization directions in the second embodiment of this invention.

FIG. 13 shows percentages of polarization directions in the second embodiment of this invention. Percentages for a same rectangle size differs in FIG. 7 and FIG. 13. This the difference comes from difference of spacing between the post base and the active layer. As a conclusion, it can be said from the result shown in FIG. 13 that polarization in 0° can also be obtained from a same configuration (6×5 μm) of p-DBR when the spacing between the post base and the active layer is relatively large.

Figure 14:
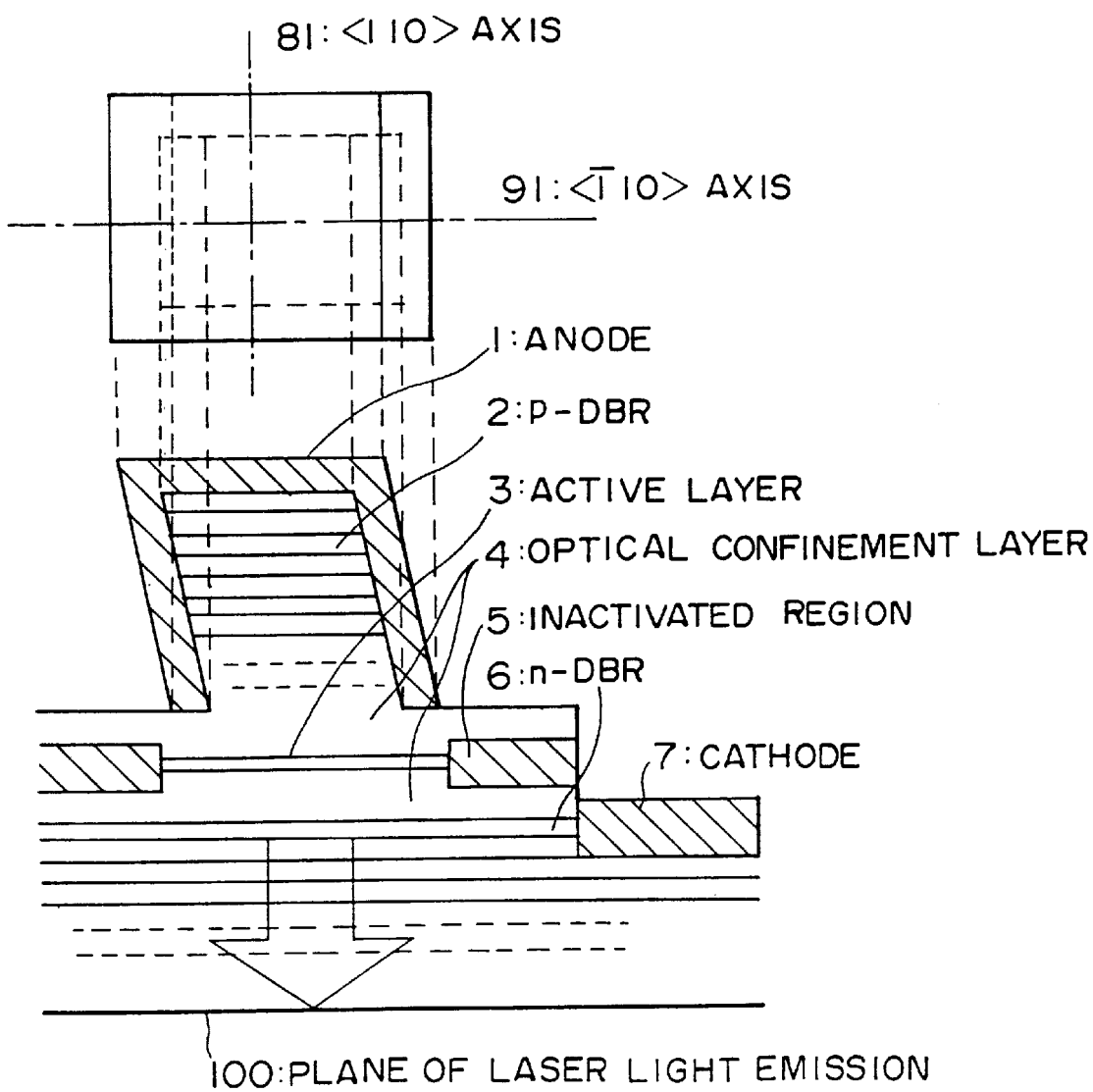
FIG. 14 shows a cross-sectional view of a VCSEL of a third embodiment of the present invention.

FIG. 14 shows a cross-sectional view of a VCSEL of a third embodiment of this invention. In the third embodiment, the p-DBR 2 composing the post is made oblique (for example, by an angle of 20°) to surfaces of the semiconductor multi-layer reflector. The oblique post is produced by holding the plane of laser light emission 100 oblique in etching process.

Figure 15:
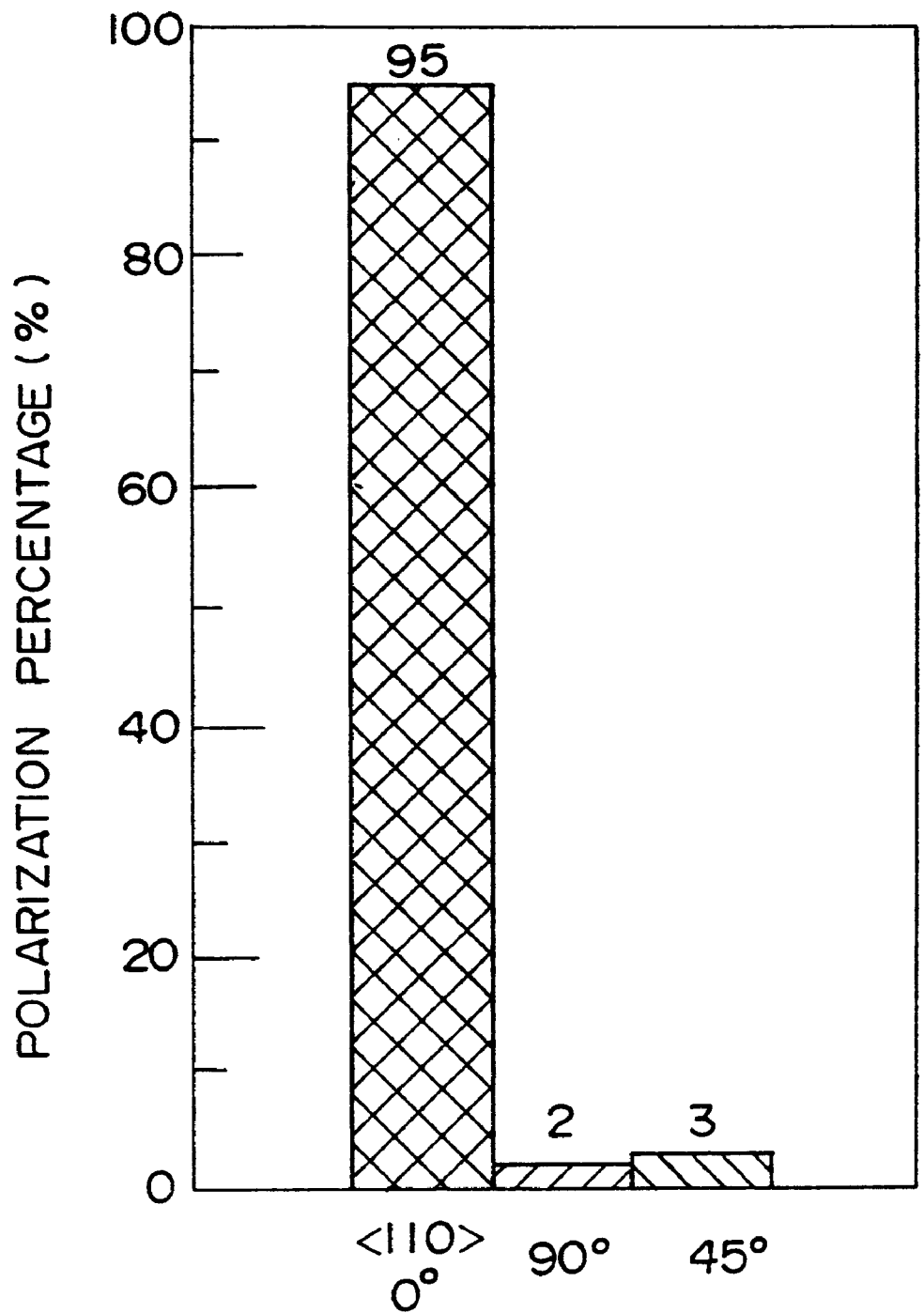
FIG. 15 shows a graph illustrating percentage of polarization directions in the third embodiment of this invention.

Mathematical analysis on laser light propagation in the oblique post is difficult because there are various factors, strain in the oblique post, for example, must be considered as affecting polarization, but it will be understood that the light polarized in a direction parallel to <110> axis 81, that is, parallel to the oblique surfaces of the post, is effectively confined in the oblique post. FIG. 15 shows percentage of a polarization direction measured for 62 VCSEL elements of FIG. 14. Ninety-five (95) percent of the elements have a polarization direction of 0° (parallel to the axis <110>).

In the embodiment shown by FIG. 14, the cross-section of the post (by a plane parallel to the semiconductor multi-layer reflectors) is a square, but any other shape of cross-section can be used in this embodiment. The size of the cross-section is not limited in the third embodiment, but it is preferable that only a single mode of oscillation can exist in the cross-section. Thus, a cross-section of 6 μm×6 μm is used in the embodiment shown by FIG. 14.

Figure 16:
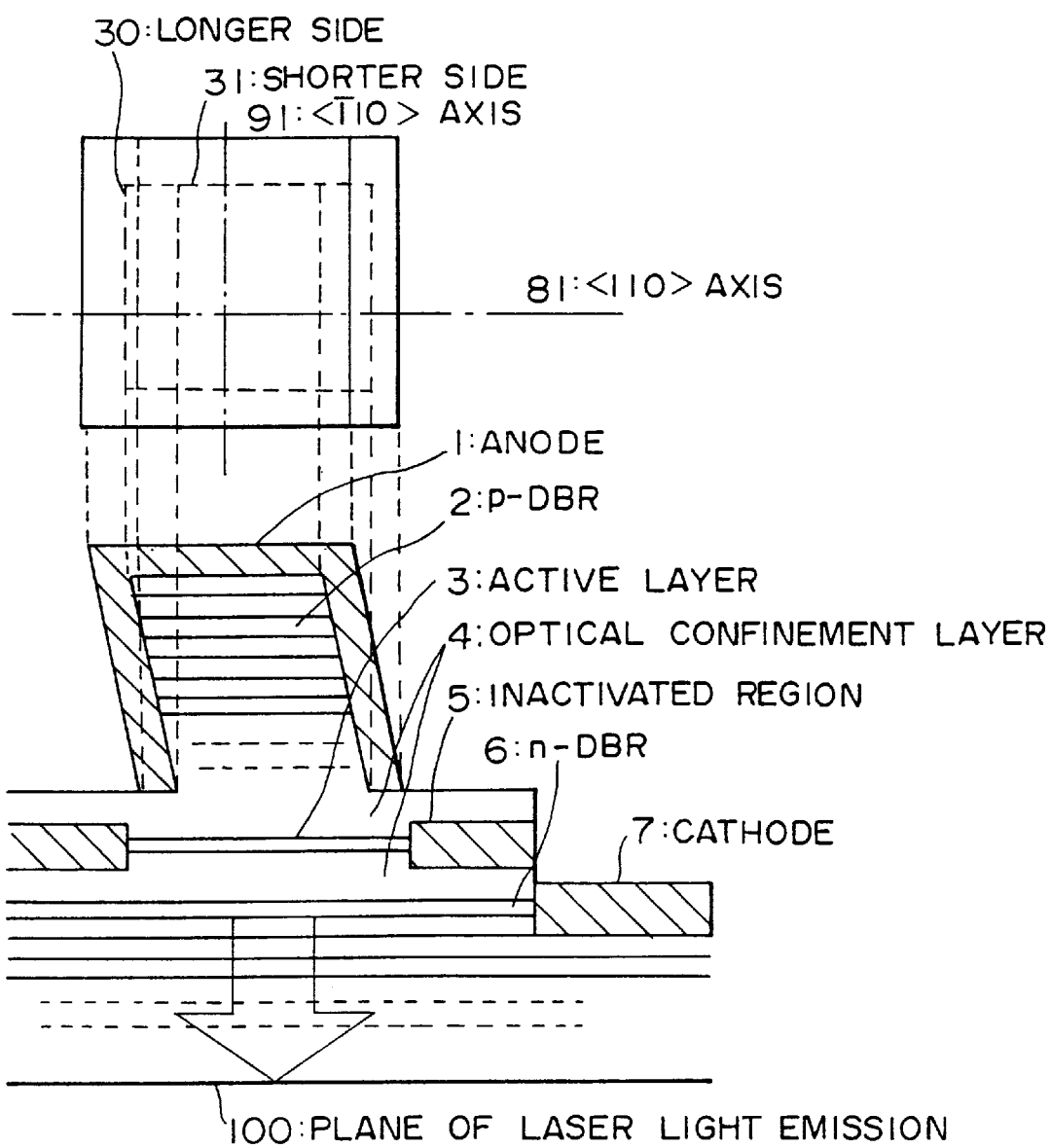
FIG. 16 shows a modification of the third embodiment shown in FIG. 14.

FIG. 16 shows a modification of FIG. 14, wherein post cross-section is 6 μm×5 μm. The oblique surfaces of the post can be parallel either to a long side 30 or to a short side 31. In either case, polarization direction of the emitted laser is in parallel to the long side 30. This is assumed to come from a fact that laser light having polarization not parallel to the long side 30 goes out more easily from surfaces of the long side 30.

Figure 17:
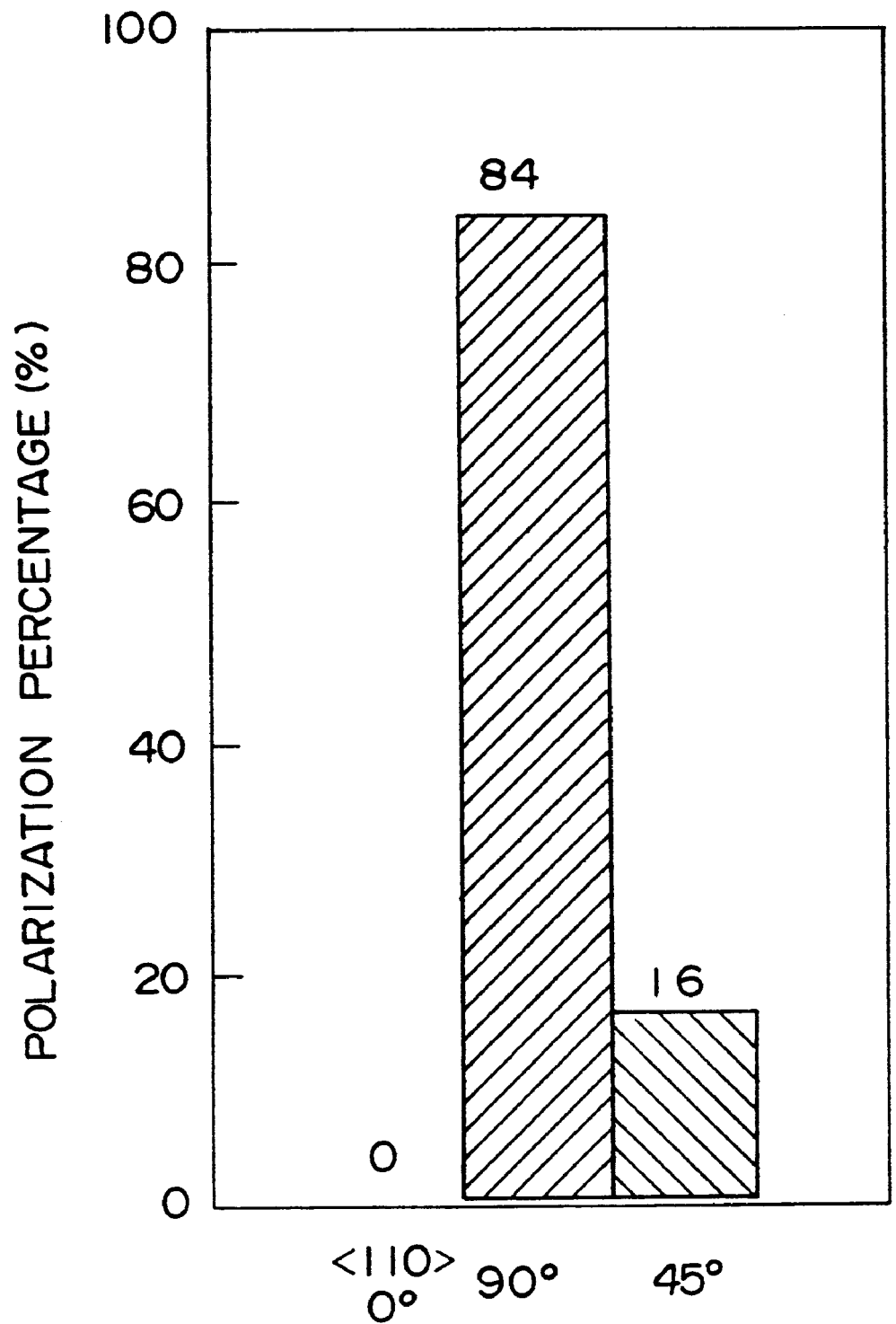
FIG. 17 shows a graph illustrating percentage of polarization directions in the VCSELs shown in FIG. 16.

FIG. 17 shows percentage of polarization direction measured for 64 VCSEL elements of FIG. 16, wherein oblique surfaces are parallel to the long side 30. There is no element having a polarization direction vertical to the long side 30. Elements having polarization direction 45° to the long side 30 are supposed to come from rounded edges of the rectangular post by light exposure at making a rectangular etching mask.

Some of the VCSEL-based devices will be described in the following paragraphs.

Figure 18:
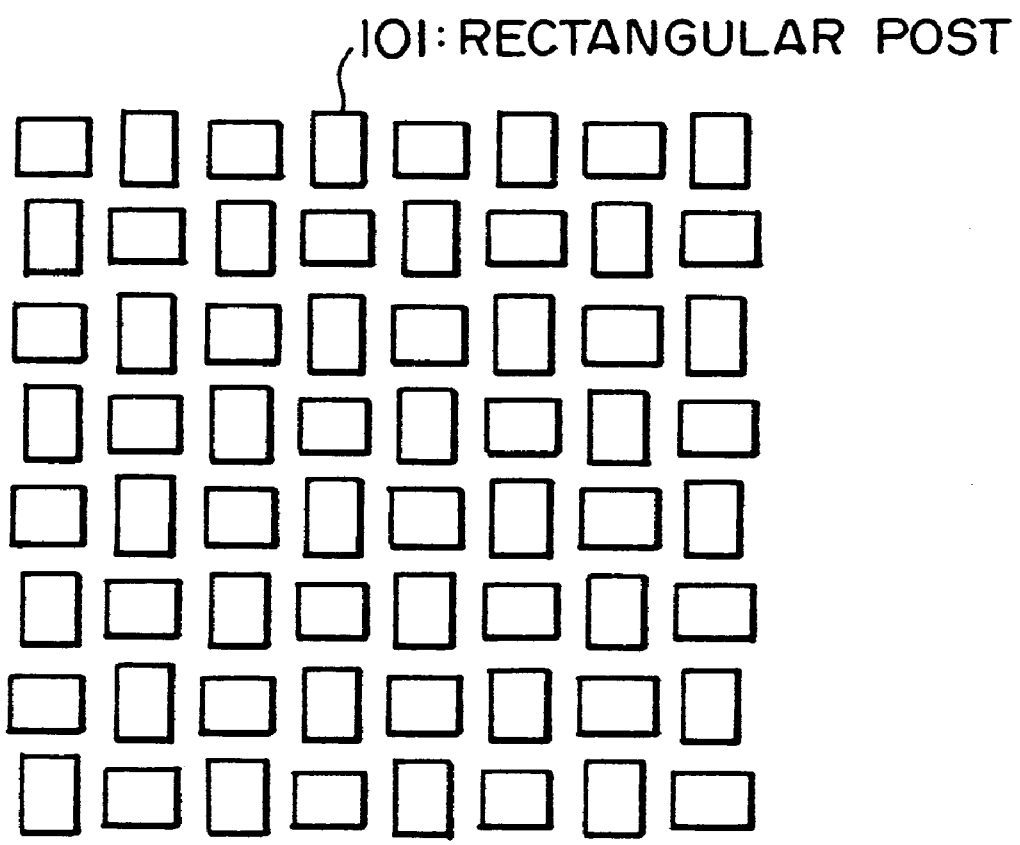
FIG. 18 shows a matrix array of VCSELs wherein direction of polarization of each VCSEL element is perpendicular to that of the preceding element.

FIG. 18 shows a plan view of a matrix array of VCSELs of this invention. The substrate is polished to a thickness of 100 μm, doping is made to $4\times10^{18}$ cm$^{-3}$ at parts in contact with electrodes, and is made less than $1\times10^{18}$ cm$^{-3}$ at the semiconductor multi-layer reflectors. Each of these rectangular posts is arranged in perpendicular in cross-section to the preceding (in row and in column) post.

Figure 19:
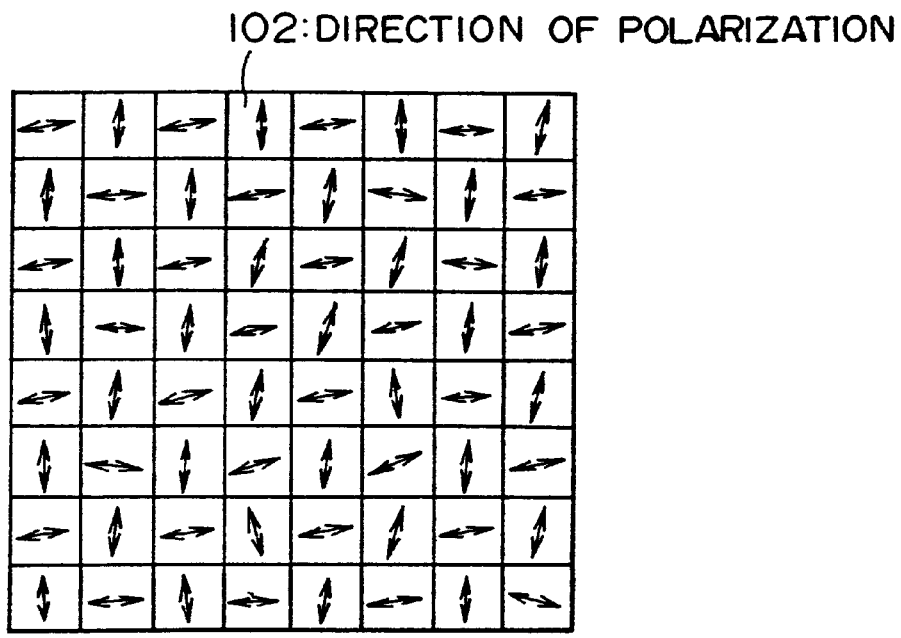
FIG. 19 shows directions of polarization of each VCSEL element of FIG. 18.
Figure 20:
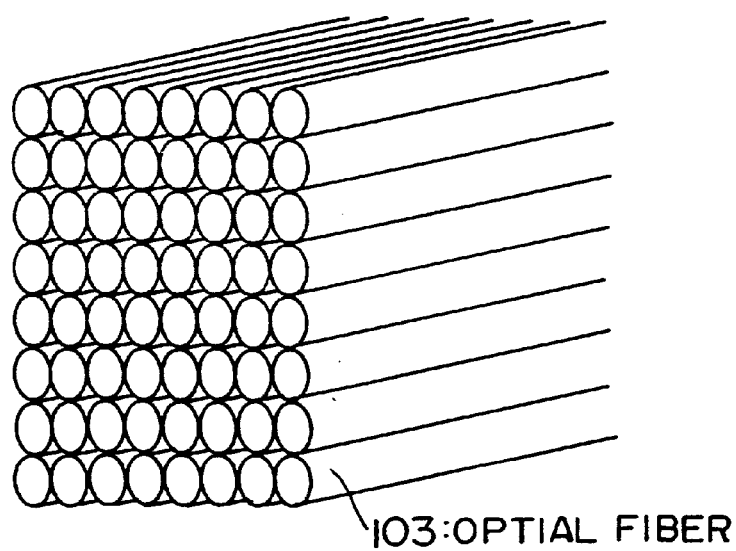
FIG. 20 shows a two-dimensional fiber array to be coupled to an array of VCSELs.

FIG. 19 shows directions of polarization of each VCSEL element of FIG. 18. Direction of polarization 102 of each element in 8×8 matrix of 125 μm pitch, is practically perpendicular to that of the preceding element. When the laser array of FIG. 19 is coupled to an optical fiber array 103 shown in FIG. 20, cross-talk will be substantially reduced by inserting an array of polarizers (not shown in the drawing) on the face of the optical fiber array 103. Thus, allowance of the lateral position discrepancy between the laser array and the optical fiber array 103 can be increased at least by a factor of $\sqrt{2}$.

Figure 21:
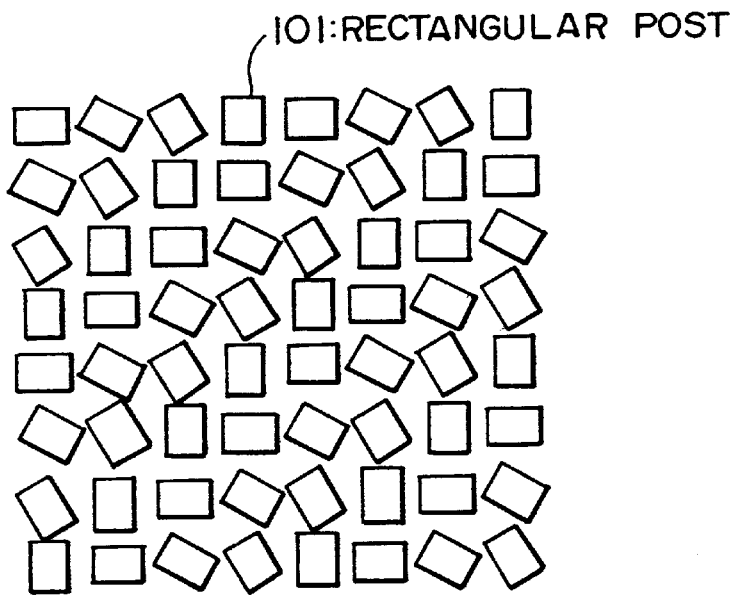
FIG. 21 shows a matrix array of VCSELs wherein the direction of polarization of each VCSEL element lags 30 degrees to that of the preceding element.

FIG. 21 shows a matrix array of VCSELs wherein the direction of polarization of each VCSEL element lags 30 degrees to that of the preceding element. When laser light emitted from the array of FIG. 21 passes a polarizer having a polarization direction parallel to that of an element, the beams are attenuated by cos 0°, cos 30°, cos 60°, cos 90° respectively. This attenuation of laser light without any driving device can be used in optical instruments.

Similarly, a matrix array of VCSELs can be fabricated wherein polarization directions of elements have, for example, seven (7) different values from 0° to 90° separated by 15° step, and can be used similarly in optical instruments.

Figure 22:
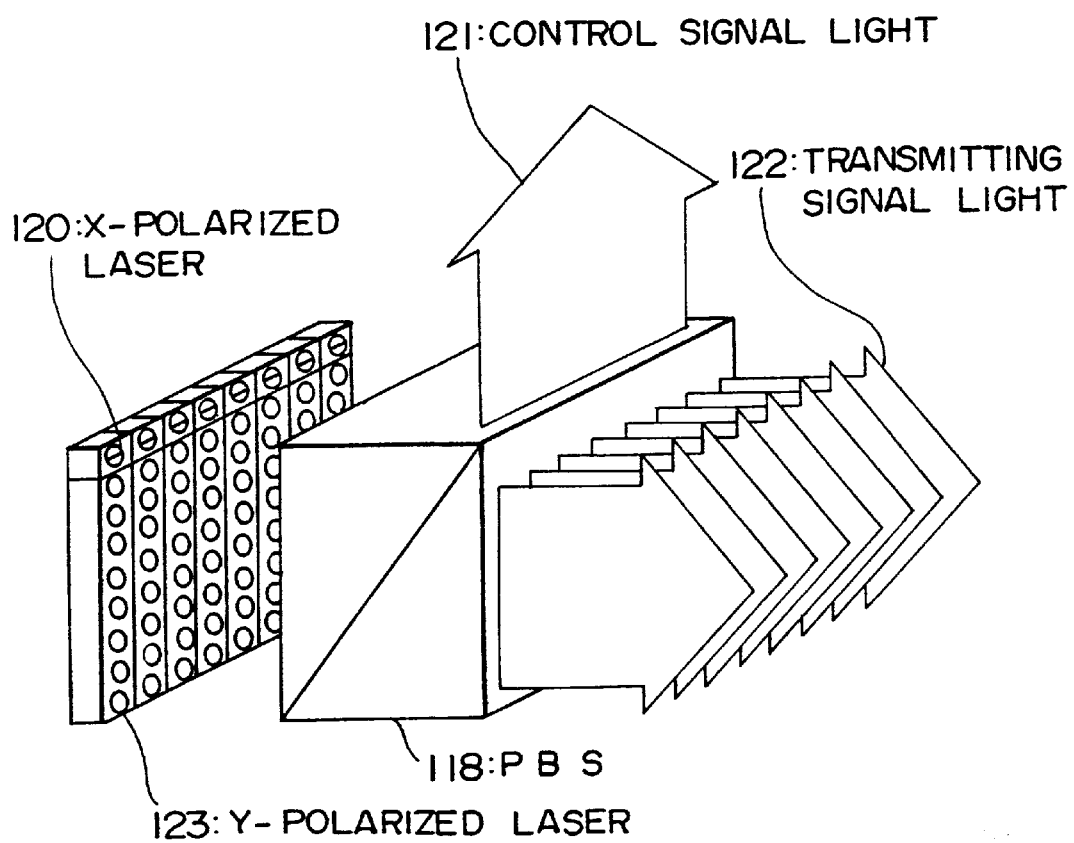
FIG. 22 shows a matrix array of VCSELs wherein plural lines of VCSELs are arranged in columns, each line of the plural lines of VCSELs having 8 (eight) signal transmitting lasers and 1 (one) control laser.

An example of an optical interconnection device is shown in FIG. 22. A row of eight Y-polarized laser elements 123 for signal transmission and an X-polarized laser element 120 for signal control constitutes a unit of laser arrays. Eight (8) units of laser arrays are arranged in columns. A polarized beam splatter (PBS) 118 transmits Y-polarized laser light in one direction and transmits X-polarized laser light in another direction. Eight Y-polarized laser elements in a unit transmits data of eight bits, and the X-polarized laser in the unit is used for controlling the unit.

Figure 23:
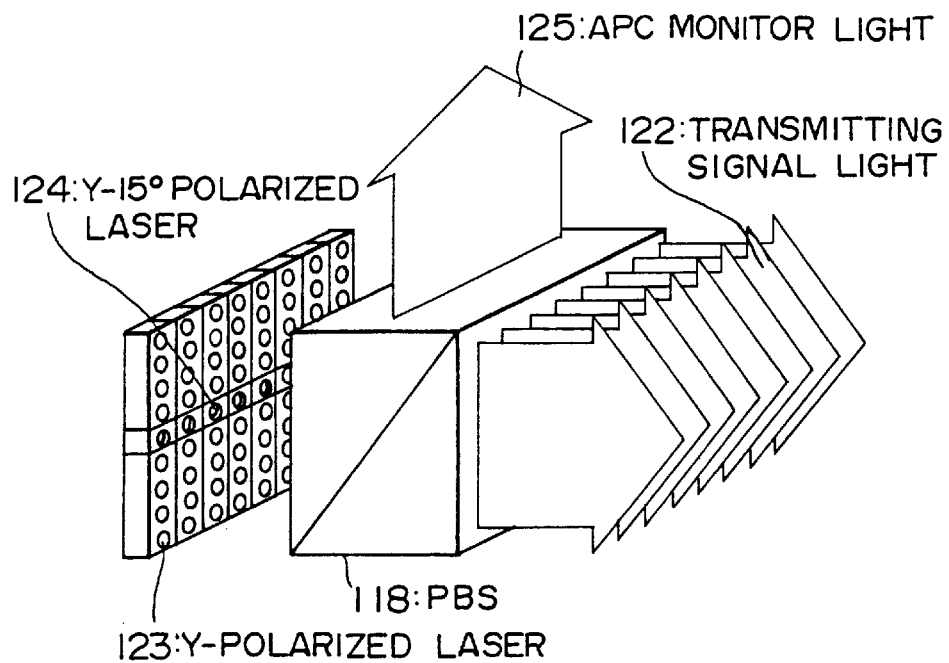
FIG. 23 shows a matrix array of VCSELs of FIG. 22, wherein the control laser in a line is used for APC monitor.

Another example of an optical interconnection device is shown in FIG. 23, wherein a unit of laser arrays has 8 Y-polarized laser elements and a Y-15° polarized laser element. A large part of the Y-15° polarized laser light (cos 15° in amplitude) is transmitted through the PBS 118, and a small part of the Y-15° polarized laser light (sin 15° in amplitude) is reflected in a perpendicular direction by the PBS 118 as APC (automatic power control) monitor light 125.

Figure 24:
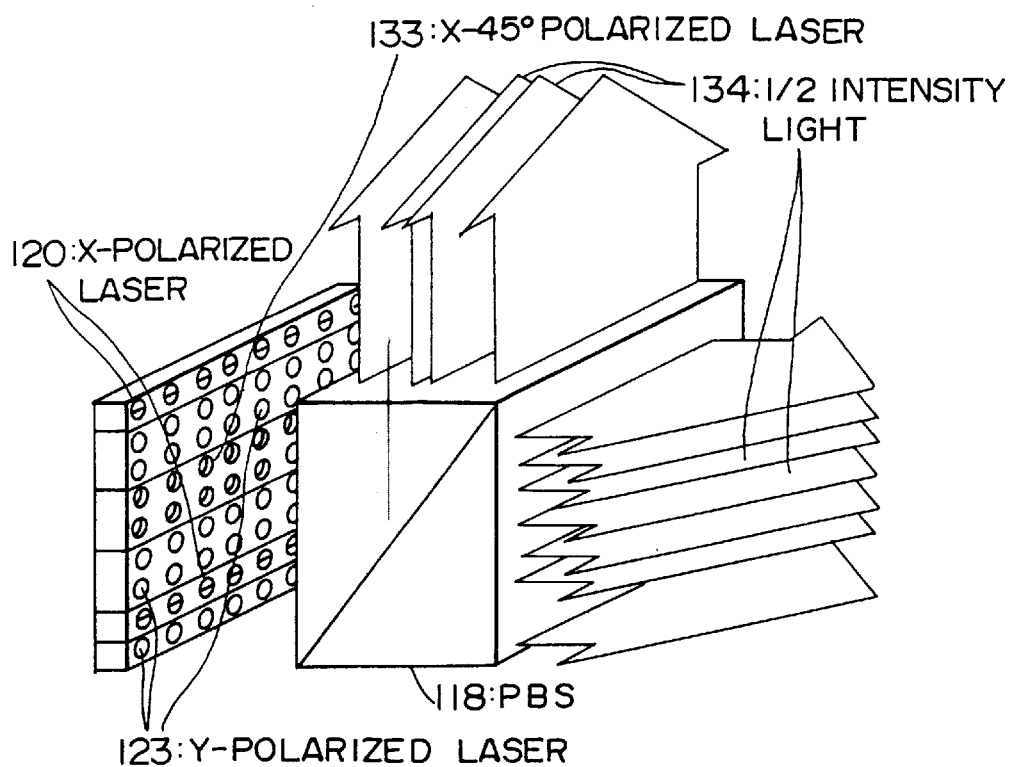
FIG. 24 shows a matrix array of VCSELs wherein the direction of polarization is uniform in a line of the array.

Still another example of an optical interconnection device is shown in FIG. 24. In this example, a unit of laser arrays has two X-polarized laser elements, five Y-polarized laser elements, and two Y-45° polarized laser elements. Y-polarized laser light 123 is transmitted through the PBS 118, and X-polarized laser light is reflected in a perpendicular direction by the PBS 118. A half of Y-45° polarized laser light ($\cos^2$ 45°) is transmitted through the PBS 118, and another half of the Y-45° polarized laser light is reflected in a perpendicular direction by the PBS 118.

It will be easily understood that more complicated spatial light path can be established by VCSELs of this invention.

Figure 25:
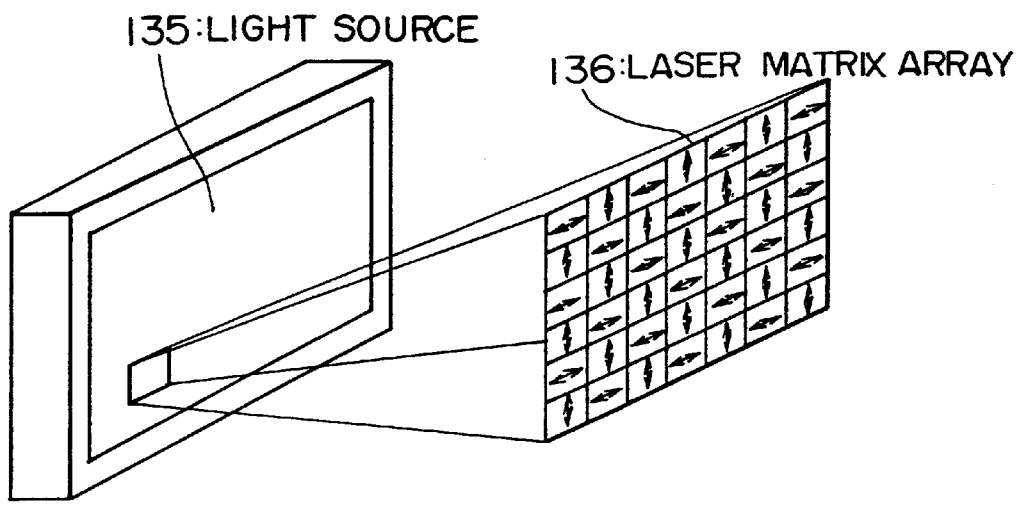
FIG. 25 shows an example of a three-dimensional display using a matrix array of VCSELs of FIG. 18.

FIG. 25 shows an example of a three-dimensional display using matrix arrays 136 of FIG. 19 in a light source 135. For example, images in a field of vision of a right eye are displayed by X-polarized light and images in a field of vision of a left eye are displayed by Y-polarized light. With polarized eye glasses, three dimensional display of the images can be observed. By this light source 135, a matrix type polarized light filter used in a prior art three-dimensional display, can be eliminated. This removes loss of light by the filter and improves system reliability, as thermal deterioration of the filter, caused by light absorption, has been a factor of degrading system reliability.

Figure 26:
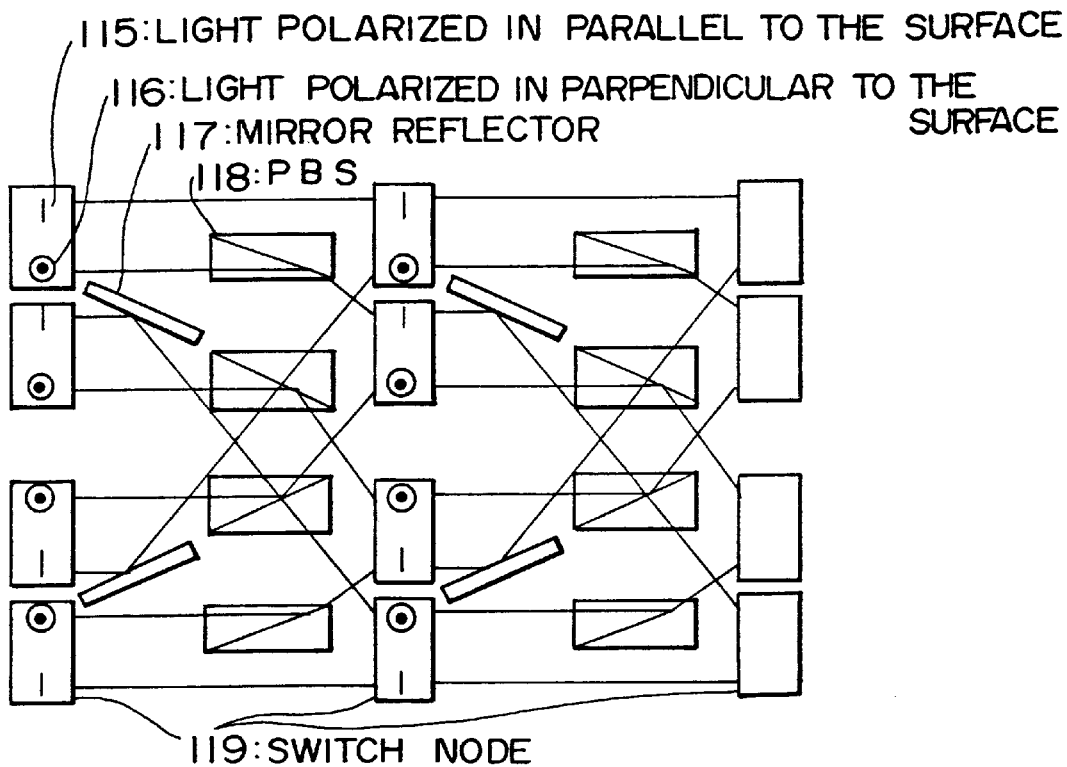
FIG. 26 shows an embodiment of this invention wherein 4×4 optical switching network is composed of a matrix array of switch nodes.

In FIG. 26, a 4×4 optical switching network is shown comprised by a matrix array of switch-nodes. A switch node 119 comprises a VCSEL emitting light polarized in parallel to the surface of the sheet, a VCSEL emitting light polarized in perpendicular to the surface of the sheet, two photo-detectors and a selector (not shown in the drawing). The switch nodes 119 are arranged in 4 lines and 3 columns. In each line of the switch nodes, a PBS 118 is inserted between two switch nodes 119, and in a second and third line of the switch nodes 119, a mirror reflector 117 is inserted between two VCSELs emitting light polarized in parallel to the surface of the sheet.

Light paths are in a direction of lines of node arrangement, and when there is neither PBS 118 nor mirror reflector 117 in the light path, the light is transmitted on a same line. A PBS 118 in a light path reflects the light to a photo-detector in an adjacent line, and a mirror reflector 117 in a light path reflects the light to a photo-detector in a line separated from the original line by a predetermined number of lines. As shown in FIG. 26, the light 116 polarized perpendicular to the surface is reflected by the PBS 118, while the light 115 polarized in parallel to the surface is transmitted through the PBS 118. The selector changes interconnections between the two photo-detectors and the two VCSELs in a switch node performing laser light switching.

The switch nodes 119 of the embodiment may comprise more than two VCSELs and corresponding photo-detectors. The embodiment shown in FIG. 26 is a photo-switch network in a plane parallel to the surface of the sheet, but photo-switch networks in a plane perpendicular to the surface of the sheet, can also be constituted.

Figure 27:
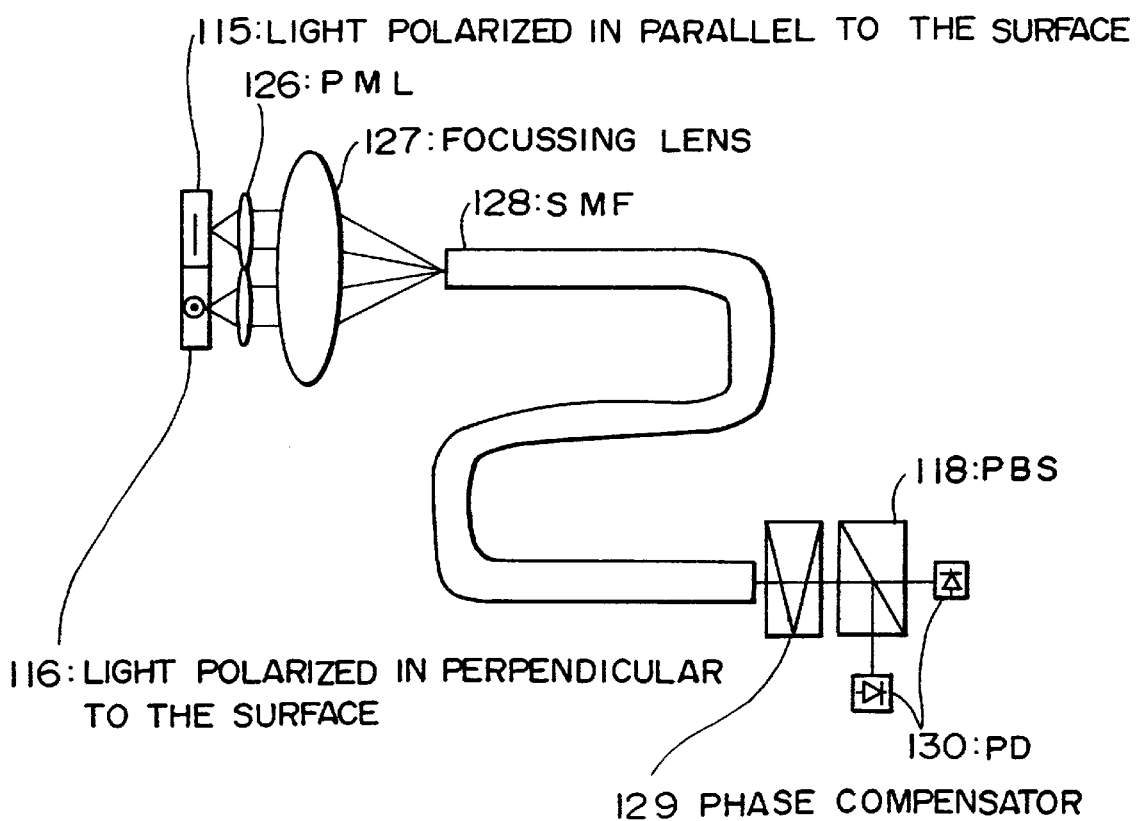
FIG. 27 shows a block diagram of polarized multiplex transmission.

FIG. 27 shows a block diagram of a polarized multiplex transmitter. The light source of this transmitter comprises a VCSEL for emitting light 115 polarized in parallel to the surface of the sheet and a VCSEL for emitting light 116 polarized perpendicular to the surface of the sheet. These polarized lights 115 and 116 are respectively collimated by PMLs (planar micro lenses) 126 and are coupled to an SMF (single mode fiber) 128, the through a focussing lens 127. In the SMF 128 orthogonal relation between the two polarized lights is maintained. In the transmission through the SMF 128, the direction of polarization may diverge in the plane of polarization. This divergence of polarization in a plane is compensated by a phase compensator (Soleil-Babinet compensator) 129. The two polarized lights 115 and 116 are separated and detected by photo-detectors 130. Thus, different signals can be transmitted on a single SMF by differently polarized light.

Figure 28:
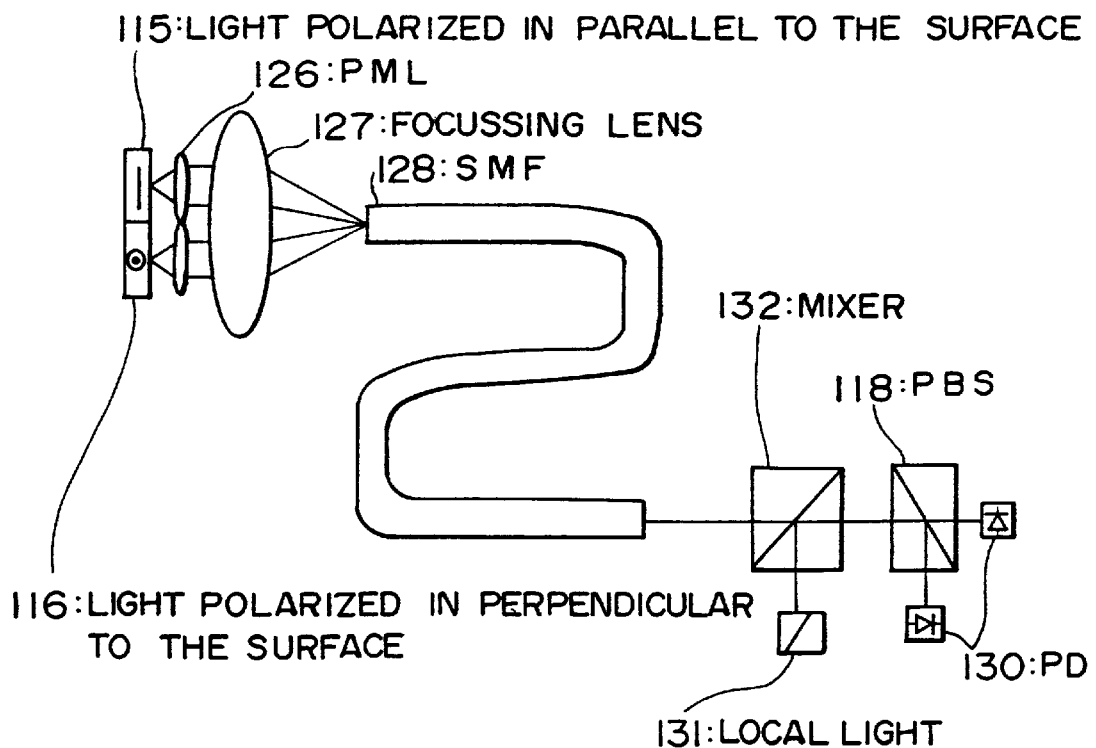
FIG. 28 shows a block diagram of an optical transmitter of polarization shift keying using VCSELs.
Figure 29:
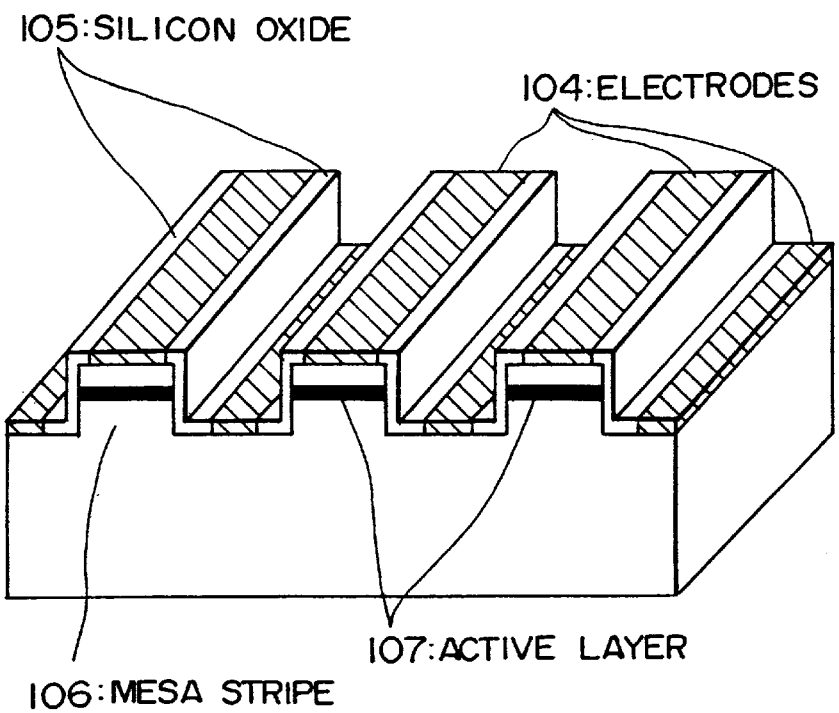
FIG. 29 shows a perspective view of a monolithic striped array of end emitting lasers of a prior art.
Figure 30:
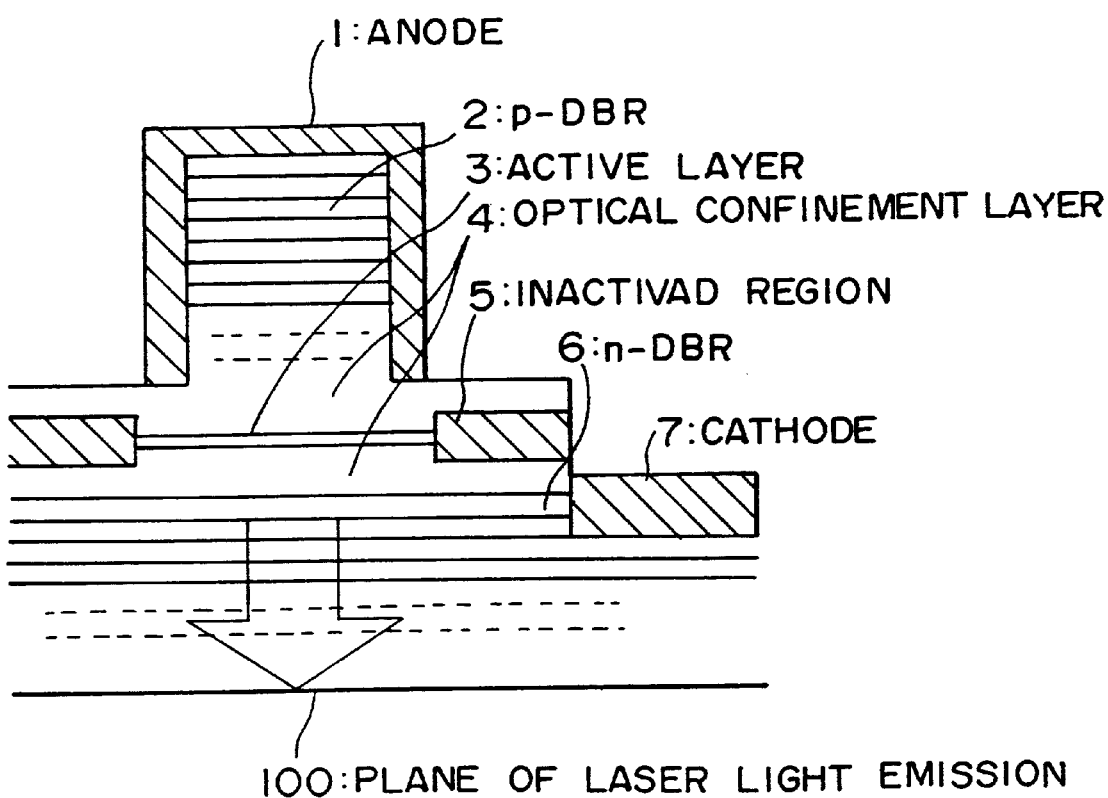
FIG. 30 shows a VCSEL with a post type p-DBR of a prior art.

FIG. 28 shows an optical transmitter of polarization shift keying. In polarization shift keying of the prior art, liquid crystal type polarization modulation elements have been used. But, modulation speed of the liquid crystal type modulator is not more than 1000 bits/s. This low keying speed has been a disadvantage in speeding-up of information processing. The modulation speed of the polarization shift keying can be increased up to several Giga-bits/s, since modulation is made by laser light excitation. Two polarized lights 115 and 116 are transmitted through an SMF 128 in a way similar to the embodiment shown in FIG. 27, and are mixed by local light 131 at a mixer 132. The mixed lights are separated in two directions by the PBS 118 and beats of the mixed lights are detected by the photo-detectors 130.

What is claimed is:

1. A monolithic type array of surface emitting laser elements, wherein said monolithic type array comprises a monolithic semiconductor substrate having a plane of laser light emission and an array of laser elements formed on said substrate, a polarization direction of each of said laser elements being predetermined, each of said laser elements comprising:

an n-side GaAs/AlAs multi-layer reflector formed on said substrate, each reflector layer of said n-side semiconductor multi-layer reflector being parallel to said plane of laser light emission;

intermediate layers formed on said n-side GaAs/AlAs multi-layer reflector, comprising optical confinement layers and an active layer for generating laser light sandwiched between said optical confinement layers, each layer of said intermediate layers being parallel to said plane of laser light emission;

a p-side GaAs/AlAs multi-layer reflector formed on said intermediate layers, each reflector layer of said p-side GaAs/AlAs multi-layer reflector being parallel to said plane of laser light emission, said p-side GaAs/AlAs multi-layer reflector being formed into a post extending substantially perpendicular to said plane of laser light emission;

an anode covering the outer surface of said post;

a cathode formed in contact with said n-side GaAs/AlAs multi-layer reflector;

said post having a rectangular cross-section parallel to said plane of laser light emission and having longer sides and shorter sides, the length of said longer said being substantially 6 $\mu$m and the length of said shorter sides being less than or equal to substantially 5 $\mu$m;

a spacing being provided between a bottom surface of said post and said active layer being about one wavelength of said laser light; and a polarization plane of said laser light being parallel to said longer sides.

2. A monolithic type array of surface emitting laser elements comprising:

a plurality of surface emitting laser elements, each laser element emits laser light at a respective one of a set of polarization angles, each of said polarization angles of said set being different from another polarization angle of said set by 30°.

3. An optical interconnection device, comprising:

an array of surface emitting laser elements each emitting a laser light having a polarization direction; and at least one polarizer which separates laser light from said monolithic type array of surface emitting laser elements based upon said polarization direction.

4. An optical interconnection device comprising:

a monolithic type array of surface emitting laser elements; and at least one polarized beam splitter; wherein said monolithic type array is divided into at least one unit of laser elements, each of said at least one unit comprising a first number of laser elements producing laser light having a first polarization direction and a second number of laser elements producing laser light having a second polarization direction which is perpendicular to said first polarization direction; and said at least one polarized beam splitter separates laser light from said monolithic type array into signal light for transmission and control signal light, based upon said first and second polarization direction.

5. An optical interconnection device of claim 4, wherein said control signal light is used for monitoring said monolithic type array.

6. An optical interconnection device, comprising:
a monolithic type array of surface emitting laser elements, wherein a polarization direction of laser light produced by each of said laser elements is predetermined; and
at least one polarized beam splitter coupled to said array and which transmits laser light having a first polarization direction to a first path, transmits laser light having a second polarization direction perpendicular to said first polarization direction to a second path, and splits laser light having other polarization directions distinct from said first and second polarization direction between said first and said second path.

7. A three-dimensional display unit, comprising:
at least one monolithic type array of surface emitting laser elements, said laser elements being used as light source; wherein
said monolithic type arrays including laser elements having a first polarization direction and laser elements producing laser light having a second polarization direction perpendicular to said first polarization direction; and wherein
images in a field of vision of a right eye are displayed by said laser light produced by said array and polarized in said first polarization direction, while images in a field of vision of a left eye are displayed by said laser light produced by said array and polarized in said second polarization direction.

8. An optical switching network, comprising:
an array of switch nodes, each of said switch nodes including a first surface emitting laser which emits laser light polarized in a first direction, a second surface emitting laser which emits laser light polarized in a second direction perpendicular to said first direction, at least one photo-detector, and a selector for changing connection between said photo-detector and said first and second surface emitting laser; and
at least one reflector disposed between switch nodes in laser light paths of said array, each of said reflectors reflecting one of laser light polarized in said first direction and laser light polarized in said second direction to a desired photodetector.

9. A polarized multiplex transmitter, comprising:
an array of surface emitting lasers including at least one surface emitting laser which emits laser light polarized in a first direction and at least one surface emitting laser which emits laser light polarized in a second direction which is perpendicular to said first direction;
an optical fiber, coupled to said surface emitting lasers, which transmits said laser light polarized in said first direction and laser light polarized in said second direction; and
an optical unit which focuses said laser light polarized in said first direction and said laser light polarized in said second direction from said surface emitting lasers into said optical fiber.

10. An optical transmitter for polarization shift-keying comprising:
a first surface emitting laser which emits laser light polarized in a first direction;
a second surface emitting laser which emits laser light polarized in a second direction which is perpendicular to said first direction; and a keyer which excites said first surface emitting laser or said second surface emitting laser in accordance with signal logic.

11. A polarized multiplex transmitter, comprising:
at least one surface emitting laser which emits laser light polarized in a first direction;
at least one surface emitting laser which emits laser light polarized in a second direction which is perpendicular to said first direction; and
an optical fiber, coupled to said surface emitting lasers, which transmits said laser light polarized in said first direction and said laser light polarized in said second direction.

12. The polarized multiplex transmitter as claimed in claim 9, wherein said surface emitting lasers are coupled to a first end of said optical fiber, and further comprising at least one photodetector coupled to a second end of said optical fiber.

13. The polarized multiplex transmitter as claimed in claim 9, wherein said surface emitting lasers are coupled to a first end of said optical fiber, and further comprising a phase compensator coupled to a second end of said optical fiber.

14. The polarized multiplex transmitter as claimed in claim 11, wherein said surface emitting lasers are coupled to a first end of said optical fiber, and further comprising at least one photodetector coupled to a second end of said optical fiber.

15. The polarized multiplex transmitter as claimed in claim 11, wherein said surface emitting lasers are coupled to a first end of said optical fiber, and further comprising a phase compensator coupled to a second end of said optical fiber.

16. The polarized multiplex transmitter as claimed in claim 9, further comprising a collimator disposed between said surface emitting lasers and said optical fiber.

17. The polarized multiplex transmitter as claimed in claim 11, further comprising a collimator disposed between said surface emitting lasers and said optical fiber.

18. A transmission system for transmitting information through polarization shift-keying, said transmission system comprising:
a first surface emitting laser which emits laser light polarized in a first direction;
a second surface emitting laser which emits laser light polarized in a second direction which is perpendicular to said first direction;
a keyer which excites said first surface emitting laser or said second surface emitting laser in accordance with signal logic;
an optical fiber, a first end of said optical fiber being coupled to said first and second surface emitting laser;
a mixer coupled to a second end of said optical fiber and coupled to a source of local light, said mixer mixes said local light and light output from said optical fiber and outputs mixed light; and
a photodetector coupled to said mixer, said photodetector detects said mixed light.

19. A method of transmitting information through polarization shift keying, said method comprising the acts of:
selectively actuating a first surface emitting laser which emits first light polarized in a first direction;
selectively actuating a second surface emitting laser which emits second light polarized in a second direction that is perpendicular to said first direction; and controlling the actuation of said first and second surface emitting laser in accordance with signal logic indicative of said information.

20. The method as claimed in claim 19, further comprising the acts of:
   transmitting said first and second light emitted from said first and second surface emitting lasers through an optical fiber;
   mixing light outputted from said optical fiber with local light, thereby producing mixed light;
   separating said mixed light into first received light polarized in said first direction and second received light polarized in said second direction; and
   detecting said first and second received light.

21. An array of surface emitting laser elements comprising:
   a plurality of surface emitting laser elements arranged in a matrix; and
   a sequence of polarization angles, each angle in said sequence being different from another angle in said sequence by thirty degrees; wherein each of said surface emitting laser elements emit light at a respective one of said polarization angles in said sequence.

22. A matrix of surface emitting laser elements comprising:
   at least one subgroup of linearly arranged surface emitting laser elements;
   wherein each surface emitting laser element in a specific subgroup emits light at a polarization direction which is different from another surface emitting laser in said specific subgroup by thirty degrees.

23. An array of surface emitting laser elements comprising:
   a predetermined set of n polarization angles, each angle of said set being different from another angle in said set by thirty degrees, n being an integer greater than 1; and
   a matrix of m surface emitting lasers, each of said surface emitting lasers emitting laser light at a respective one of said polarization angles, m being an integer greater than n.

* * * * *

UNITED STATES PATENT AND TRADEMARK OFFICE
CERTIFICATE OF CORRECTION

PATENT NO. : 6,154,479
DATED : November 28, 2000
INVENTOR(S) : Yoshikawa et al.

It is certified that error appears in the above-identified patent and that said Letters Patent is hereby corrected as shown below:

[30]     Foreign Application Priority Data

March 9, 1995  [JP]    Japan .............................. 49638/1995

Signed and Sealed this

Twenty-third Day of October, 2001

Attest:

NICHOLAS P. GODICI
*Attesting Officer*        *Acting Director of the United States Patent and Trademark Office*